(12) United States Patent
Orino

(10) Patent No.: US 8,154,707 B2
(45) Date of Patent: Apr. 10, 2012

(54) ILLUMINATION OPTICAL SYSTEM AND EXPOSURE APPARATUS HAVING THE SAME

(75) Inventor: Kanjo Orino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 653 days.

(21) Appl. No.: 12/330,910

(22) Filed: Dec. 9, 2008

(65) Prior Publication Data

US 2009/0091735 A1     Apr. 9, 2009

Related U.S. Application Data

(63) Continuation of application No. 10/959,350, filed on Oct. 6, 2004, now Pat. No. 7,499,145.

(30) Foreign Application Priority Data

Oct. 10, 2003 (JP) ................................. 2003-351980

(51) Int. Cl.
    *G03B 27/54*     (2006.01)
    *G02B 15/02*     (2006.01)

(52) U.S. Cl. ............................. 355/67; 355/53; 359/673

(58) Field of Classification Search .................... 355/53, 355/67; 359/672–675
See application file for complete search history.

(56) References Cited

U.S. PATENT DOCUMENTS

| | | | |
|---|---|---|---|
| 4,526,443 A | 7/1985 | Hirose | |
| 5,245,384 A | 9/1993 | Mori | |
| 5,619,376 A * | 4/1997 | Kudo | ............................ 359/619 |
| 5,726,740 A | 3/1998 | Shiozawa et al. | |
| 5,912,725 A | 6/1999 | Tanitsu | |
| 7,142,283 B2 * | 11/2006 | Shiozawa | ........................ 355/53 |
| 2002/0109108 A1 | 8/2002 | Mizouchi | |
| 2003/0021579 A1 | 1/2003 | Shinoda | |
| 2003/0151730 A1 | 8/2003 | Shinoda | |

FOREIGN PATENT DOCUMENTS

| | | |
|---|---|---|
| DE | 101 44 246 A1 | 3/2003 |
| DE | 102 29 249 A1 | 9/2003 |
| EP | 0 564 264 A1 | 10/1993 |
| EP | 1 237 043 A2 | 9/2002 |

(Continued)

OTHER PUBLICATIONS

English translation of JP 2003-017896, which corresponds to German Patent No. DE 101 44 246 A1.

(Continued)

*Primary Examiner* — Hung Henry Nguyen
*Assistant Examiner* — Steven H Whitesell Gordon
(74) *Attorney, Agent, or Firm* — Canon U.S.A., Inc. IP Division

(57) ABSTRACT

An illumination optical system for illuminating an object surface using light from a light source, the illumination optical system includes, a first optical system that includes a movable unit that is movable along an optical axis, said first optical system guiding the light to the object surface and varying an irradiation area on a certain plane, and a second optical system that can be located on and removed from an optical path of said first optical system, the second optical system varies, when located on the optical path of said first optical system, the irradiation area on the certain plane in cooperation with said first optical system, while maintaining a shape of a light intensity distribution on the certain plane, relative to the irradiation area irradiated only by said first optical system.

10 Claims, 20 Drawing Sheets

FOREIGN PATENT DOCUMENTS

| | | |
|---|---|---|
| JP | 11-260708 | 9/1999 |
| JP | 2002-055279 | 2/2002 |
| JP | 2002-217085 | 8/2002 |
| JP | 2003-017896 | 1/2003 |
| JP | 2003-100622 | 4/2003 |
| JP | 2003-178952 | 6/2003 |
| JP | 2003-243276 | 8/2003 |

OTHER PUBLICATIONS

An Official Communication from the EPO issued on Nov. 25, 2005 for EP Application No. 04256153.0-2222.

An Official Communication from the EPO issued on Feb. 9, 2006 for EP Application No. 04256153.0-2222.

* cited by examiner

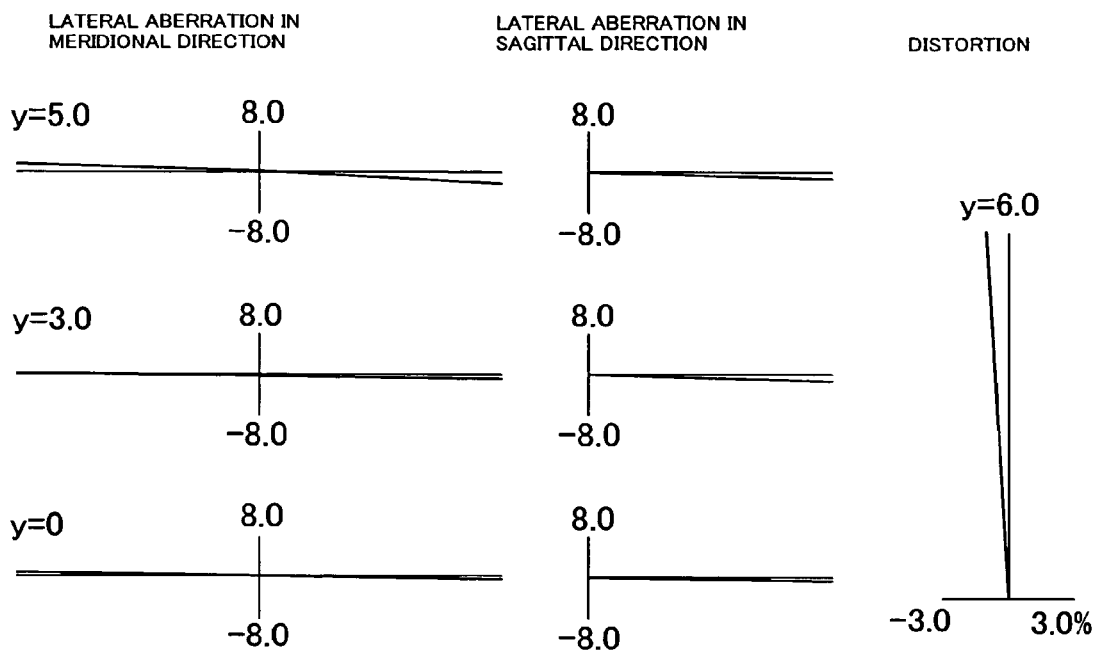

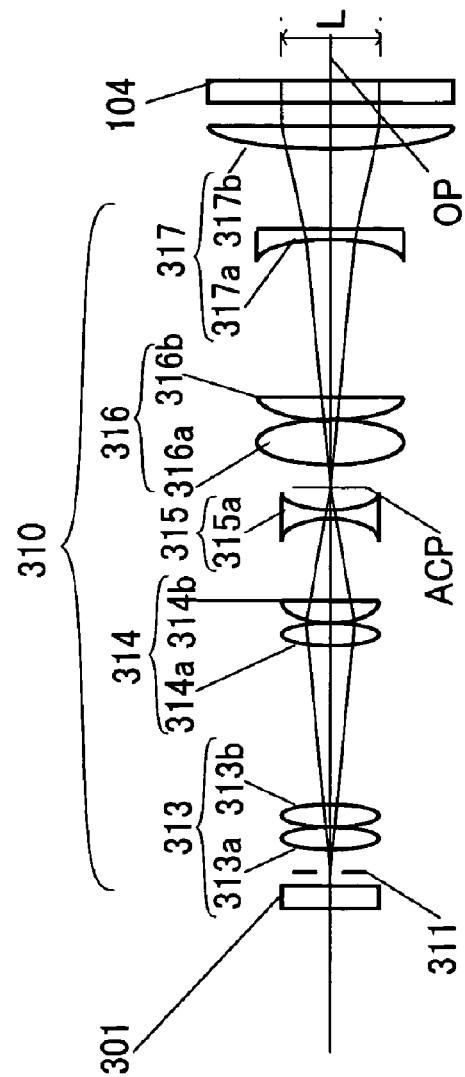
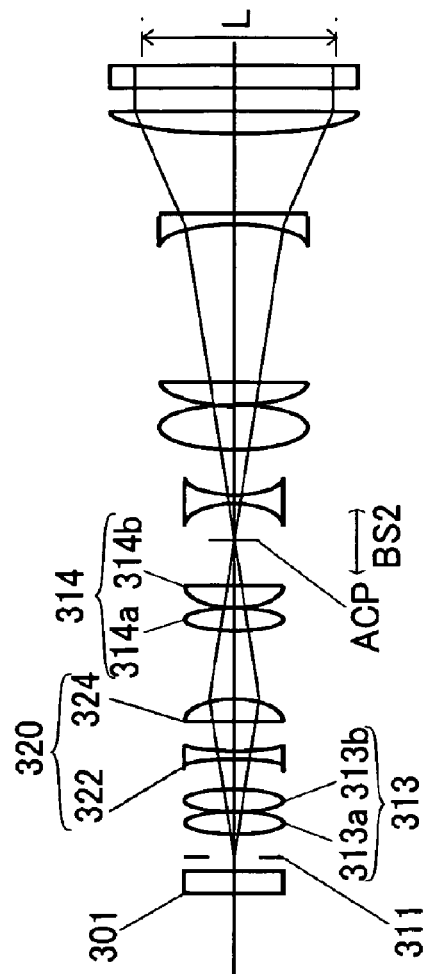
FIG. 9A
FIG. 9B

ILLUMINATION OPTICAL SYSTEM AND EXPOSURE APPARATUS HAVING THE SAME

This application is a continuation of prior application Ser. No. 10/959,350, filed Oct. 6, 2004, which is incorporated by reference herein in its entirety as if fully set forth.

This application claims the right of priority under 35 U.S.C. §119 based on Japanese Patent Application No. 2003-351980, filed on Oct. 10, 2003, which is also incorporated by reference herein in its entirety as if fully set forth.

BACKGROUND OF THE INVENTION

The present invention relates generally to an illumination optical system, and more particularly to an illumination optical system for illuminating a reticle (or a mask) which forms a pattern, in an exposure apparatus used in a photolithography process for fabricating semiconductor devices, liquid crystal display devices, image pick-up devices (CCD, and the like), thin-film magnetic heads, and the like.

The photolithography technology for manufacturing fine semiconductor devices, such as LSIs and very large scale integrations, has conventionally employed a reduction projection exposure apparatus that uses a projection optical system to project and transfer a circuit pattern formed on a reticle onto a wafer, etc. As the recent improved packaging density of the semiconductor devices requires finer patterns, the exposure apparatus needs to improve the resolution (to correspond to the fine processing).

The improved resolution of the exposure apparatus generally requires optimizations of both the numerical aperture ("NA") of the projection optical system and the NA of the illumination optical system. Concretely, the illumination optical system optimizes the resolution and the contrast for a certain circuit pattern by adjusting a value of the coherence factor σ that corresponds to a ratio between the NA of the projection optical system and the NA of the illumination optical system. For example, an illumination optical system proposed in Japanese Laid-Open Patent Application No. 2002-217085 (corresponding to published United States Application No. 2002/109108) typically has a σ consecutively variable optical system that can continuously change a σ value.

FIG. 20 is a simplified optical-path diagram of a σ variable optical system 1000. The σ variable optical system 1000 has, in order from an exit side of a columnar glass HCD that has section shape of hexagon, an aperture stop 1010, a parallel plate 1020, a first lens unit 1100 that has a convex lenses 1110 and 1120, a second lens unit 1200 that has a concave lens 1210, a third lens unit 1300 that has convex lenses 1310 and 1320, and a fourth lens unit 1400 that has a concave lens 1410 and a convex lens 1420.

The σ variable optical system 1000 can continuously change a size of an irradiated area (illumination area) L or a value of σ by moving the concave lens 1210 in the second lens unit 1200 in the direction of arrow A along the optical axis, and by moving the convex lenses 1310 and 1320 as one member in the third lens unit 1300 in the direction of arrow B along the optical axis. FIG. 20A shows the minimum σ state that minimizes the irradiated area L, FIG. 20B shows the maximum σ state that maximizes the irradiated area L, and FIG. 20C shows the intermediate state in which the irradiated area L is between the minimum σ state and the maximum σ state.

The σ variable optical system 1000 of the configuration shown in FIG. 20 forms a re-condensing position ACP between the second lens unit 1200 and the third lens unit 1300 that are movable units, for the light emitted from a secondary light source position TLP that is a condensing position of the light irradiated from a light source. The re-condensing position ACP becomes the closest to the lens in the second lens unit 1200 or the third lens unit 1300, in the maximum σ state shown in FIG. 20C.

The high light energy density at the re-condensing position causes deteriorations in the internal transmittance of an optical material that composes the lens, and anti-reflection coatings applied onto the lens surfaces. In other words, the re-condensing position located near the lens would damage the lens, deteriorate its light intensity, and decrease the throughput of the exposure apparatus.

The illumination optical system of FIG. 20 arranges the re-condensing position between the movable units, as the above-mentioned, and has restrictions that it cannot expand a zooming range at a side of the high magnifying power of the σ variable optical system or a large σ side so as to prevent damages of the lens. Therefore, the illumination optical system may not possibly obtain the optimized σ or achieve the desired resolution for some circuit patterns.

BRIEF SUMMARY OF THE INVENTION

Accordingly, it is an exemplary object of the present invention to provide an illumination optical system and an exposure apparatus having the same that prevent the reduced throughput due to the deteriorated light intensity, expand the zooming range, and provide the high-quality exposure.

An illumination optical system of one aspect according to the present invention for illuminating an object surface using light from a light source, said illumination optical system includes a first optical system that includes a movable unit that is movable along an optical axis, said first optical system guiding the light to the object surface and varying an irradiation area on a certain plane, and a second optical system that can be located on and removed from an optical path of said first optical system, the second optical system varies, when located on the optical path of said first optical system, the irradiation area on the certain plane in cooperation with said first optical system, while maintaining a shape of a light intensity distribution on the certain plane, relative to the irradiation area irradiated only by said first optical system.

An illumination optical system of another aspect according to the present invention for illuminating an object surface using light from a light source, said illumination optical system includes a first optical system for guiding the light to the object surface and varying an irradiation area on a certain plane, and a second optical system that can be located on and removed from an optical path of said first optical system, a range of the variable irradiation area when said second optical system is located on the optical path is different from that when said second optical system is removed from the optical path.

An illumination optical system of another aspect according to the present invention for illuminating an object surface using light from a light source, said illumination optical system includes a first optical system that has a movable unit that is movable along an optical axis, said first optical system guiding the light to the object surface, and a second optical system that can be located on and removed from an optical path of said first optical system, a distance between a position for condensing the light from the light source and the movable unit becomes longer when said second optical system that has been removed from the optical path is located on the optical path.

An illumination optical system of another aspect according to the present invention for illuminating an object surface using light from a light source, said illumination optical system includes a first optical system that has a movable unit that is movable along an optical axis, said first optical system guiding the light to the object surface, and a second optical system that can be located on and removed from an optical path of said first optical system, a position for condensing the light from the light source moves across the movable unit when said second optical system that has been removed from the optical path is located on the optical path.

An illumination optical system of another aspect according to the present invention for illuminating an object surface using light from a light source, said illumination optical system includes a first optical element that is movable along an optical axis, and a second optical element that can be located on and removed from an optical path, a distance between a position for condensing the light from the light source and the first optical element becomes longer when said second optical system that has been removed from the optical path is located on the optical path.

An illumination optical system of another aspect according to the present invention for illuminating an object surface using light from a light source, said illumination optical system includes a first optical element that is movable along an optical axis, and a second optical element that can be located on and removed from an optical path, a position for condensing the light from the light source moves across the first optical element when said second optical system that has been removed from the optical path is located on the optical path.

An exposure apparatus of another aspect according to the present invention includes an illumination optical system for illuminating a reticle using light from a light source, and a projection optical system for projecting a pattern of the reticle onto an object, the illumination optical system includes a first optical system that includes a movable unit that is movable along an optical axis, said first optical system guiding the light to the reticle and varying an irradiation area on a certain plane; and a second optical system that can be located on and removed from an optical path of said first optical system, the second optical system varies, when located on the optical path of said first optical system, the irradiation area on the certain plane in cooperation with said first optical system, while maintaining a shape of a light intensity distribution on the certain plane, relative to the irradiation area irradiated only by said first optical system.

An exposure apparatus of another aspect according to the present invention includes an illumination optical system for illuminating a reticle using light from a light source, and a projection optical system for projecting a pattern of the reticle onto an object, the illumination optical system includes a first optical system for guiding the light to the reticle and varying an irradiation area on a certain plane, and a second optical system that can be located on and removed from an optical path of said first optical system, a range of the variable irradiation area when said second optical system is located on the optical path is different from that when said second optical system is removed from the optical path.

An exposure apparatus of another aspect according to the present invention includes an illumination optical system for illuminating a reticle using light from a light source, and a projection optical system for projecting a pattern of the reticle onto an object, the illumination optical system includes a first optical system that has a movable unit that is movable along an optical axis, said first optical system guiding the light to the reticle, and a second optical system that can be located on and removed from an optical path of said first optical system, a distance between a position for condensing the light from the light source and the movable unit becomes longer when said second optical system that has been removed from the optical path is located on the optical path.

An exposure apparatus of another aspect according to the present invention includes an illumination optical system for illuminating a reticle using light from a light source, and a projection optical system for projecting a pattern of the reticle onto an object, the illumination optical system includes a first optical system that has a movable unit that is movable along an optical axis, said first optical system guiding the light to the reticle, and a second optical system that can be located on and removed from an optical path of said first optical system, a position for condensing the light from the light source moves across the movable unit when said second optical system that has been removed from the optical path is located on the optical path.

An exposure apparatus of another aspect according to the present invention includes an illumination optical system for illuminating a reticle using light from a light source, and a projection optical system for projecting a pattern of the reticle onto an object, the illumination optical system includes a first optical element that is movable along an optical axis, and a second optical element that can be located on and removed from an optical path, a distance between a position for condensing the light from the light source and the first optical element becomes longer when said second optical system that has been removed from the optical path is located on the optical path.

An exposure apparatus of another aspect according to the present invention includes an illumination optical system for illuminating a reticle using light from a light source, and a projection optical system for projecting a pattern of the reticle onto an object, the illumination optical system includes a first optical element that is movable along an optical axis, and a second optical element that can be located on and removed from an optical path, a position for condensing the light from the light source moves across the first optical element when said second optical system that has been removed from the optical path is located on the optical path.

An exposure apparatus of another aspect according to the present invention includes an illumination optical system for illuminating a reticle using light from a light source, and a projection optical system for projecting a pattern of the reticle onto an object, said projection optical system having a numerical aperture of 0.8 or higher, the illumination optical system has a σ variable optical system for varying a coherence factor σ between from 0.2 to 1.0, a coherence factor σ being a ratio between the numerical aperture of the projection optical system and the numerical aperture of the illumination optical system.

A device fabrication method of another aspect according to the present invention includes the steps of exposing an object using an exposure apparatus, and performing a development process for the object exposed, the exposure apparatus includes an illumination optical system for illuminating a reticle using light from a light source, and a projection optical system for projecting a pattern of the reticle onto the object, the illumination optical system includes a first optical system that includes a movable unit that is movable along an optical axis, said first optical system guiding the light to the reticle and varying an irradiation area on a certain plane, and a second optical system that can be located on and removed from an optical path of said first optical system, the second optical system varies, when located on the optical path of said first optical system, the irradiation area on the certain plane in cooperation with said first optical system, while maintaining a shape of a light intensity distribution on the certain plane, relative to the irradiation area irradiated only by said first optical system.

A device fabrication method of another aspect according to the present invention includes the steps of exposing an object using an exposure apparatus, and performing a development process for the object exposed, the exposure apparatus includes an illumination optical system for illuminating a reticle using light from a light source, and a projection optical system for projecting a pattern of the reticle onto the object, the illumination optical system includes a first optical system for guiding the light to the reticle and varying an irradiation area on a certain plane, and a second optical system that can be located on and removed from an optical path of said first optical system, a range of the variable irradiation area when said second optical system is located on the optical path is different from that when said second optical system is removed from the optical path.

A device fabrication method of another aspect according to the present invention includes the steps of exposing an object using an exposure apparatus, and performing a development process for the object exposed, the exposure apparatus includes an illumination optical system for illuminating a reticle using light from a light source, and a projection optical system for projecting a pattern of the reticle onto the object, the illumination optical system includes a first optical system that has a movable unit that is movable along an optical axis, said first optical system guiding the light to the reticle, and a second optical system that can be located on and removed from an optical path of said first optical system, a distance between a position for condensing the light from the light source and the movable unit becomes longer when said second optical system that has been removed from the optical path is located on the optical path.

A device fabrication method of another aspect according to the present invention includes the steps of exposing an object using an exposure apparatus, and performing a development process for the object exposed, the exposure apparatus includes an illumination optical system for illuminating a reticle using light from a light source, and a projection optical system for projecting a pattern of the reticle onto the object, the illumination optical system includes a first optical system that has a movable unit that is movable along an optical axis, said first optical system guiding the light to the reticle, and a second optical system that can be located on and removed from an optical path of said first optical system, a position for condensing the light from the light source moves across the movable unit when said second optical system that has been removed from the optical path is located on the optical path.

A device fabrication method of another aspect according to the present invention includes the steps of exposing an object using an exposure apparatus, and performing a development process for the object exposed, the exposure apparatus includes an illumination optical system for illuminating a reticle using light from a light source, and a projection optical system for projecting a pattern of the reticle onto the object, the illumination optical system includes a first optical element that is movable along an optical axis, and a second optical element that can be located on and removed from an optical path, a distance between a position for condensing the light from the light source and the first optical element becomes longer when said second optical system that has been removed from the optical path is located on the optical path.

A device fabrication method of another aspect according to the present invention includes the steps of exposing an object using an exposure apparatus, and performing a development process for the object exposed, the exposure apparatus includes an illumination optical system for illuminating a reticle using light from a light source, and a projection optical system for projecting a pattern of the reticle onto the object, the illumination optical system includes a first optical element that is movable along an optical axis, and a second optical element that can be located on and removed from an optical path, a position for condensing the light from the light source moves across the first optical element when said second optical system that has been removed from the optical path is located on the optical path.

A device fabrication method of another aspect according to the present invention includes the steps of exposing an object using an exposure apparatus, and performing a development process for the object exposed, the exposure apparatus includes an illumination optical system for illuminating a reticle using light from a light source, and a projection optical system for projecting a pattern of the reticle onto an object, said projection optical system having a numerical aperture of 0.8 or higher, the illumination optical system has a σ variable optical system for varying a coherence factor σ between from 0.2 to 1.0, a coherence factor σ being a ratio between the numerical aperture of the projection optical system and the numerical aperture of the illumination optical system.

Other objects and further features of the present invention will become readily apparent from the following description of the preferred embodiments with reference to the accompanying drawings.

BRIEF DESCRIPTION OF THE DRAWINGS

FIG. 4 is an aberrational diagram of a first optical system shown in FIG. 3 in the minimum σ state.

FIG. 9 is a simplified optical-path diagram of a variation of a σ variable optical system shown in FIG. 2.

DETAILED DESCRIPTION OF THE PREFERRED EMBODIMENTS

A σ variable optical system of an illumination optical system of the present invention should meet three conditions on an exit side of the σ variable optical system, i.e., a zooming operation that changes an irradiated area, an immobility at the back focus position, and a telecentricity of the exit light, in order to provide an illumination optical system and an exposure apparatus having the same for preventing the lowered throughput due to the light intensity deterioration, and for expanding a zooming range to provide the high-quality exposure. In general, at least three movable units are needed to satisfy these three conditions.

However, if a second optical system, which will be described later, is introduced, only two movable units enables the immobility at the back focus position of a first optical system and the telecentric of exit light, which will be described later, to fall within a substantially permissible range, providing the σ variable optical system that has a wide zooming range without locating the re-condensing position in or near the lens. The smaller number of large-aperture lenses to be used and the shorter overall length than the configuration that uses three movable units can provide a smaller apparatus at a reduced cost.

Figure 1:
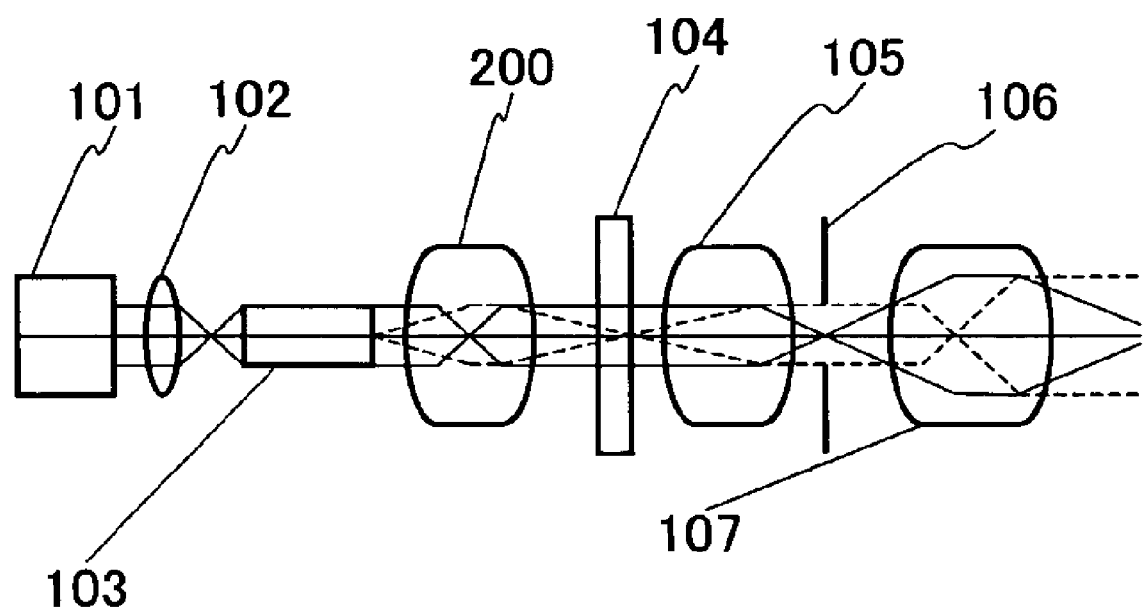
FIG. 1 is a simplified optical-path diagram for an illumination optical system as one aspect according to the present invention.

With reference to the accompanying drawings, a description will now be given of an illumination optical system of one embodiment according to the present invention. The same reference numeral in each figure denotes the same element, and a duplicate description thereof will be omitted. FIG. 1 is a simplified optical-path diagram of an illumination optical system 100 as one aspect according to the present invention. The illumination optical system 100 is a part of an illumination apparatus or an exposure apparatus.

The illumination optical system 100 includes, as shown in FIG. 1, a beam shaping optical system 101, a relay optical system 102, a first plural-light-source forming part 103, a σ variable optical system 200, a second plural-light-source forming part 104, an irradiation optical system 105, a masking blade 106, and an imaging optical system 107.

Light emitted from a light source (not shown in FIG. 1) is converted into a desired beam shape via the beam shaping optical system 101 and is introduced into the first plural-light-source forming part 103 by the relay optical system 102. In the instant embodiment, the first plural-light-source forming part 103 is a columnar glass that has a hexagonal section shape, but includes columnar glasses that have other section shapes. The columnar glass forms plural light-source images by a multiple reflection inside of the glass.

The light from the first plural-light-source forming part 103 is condensed by a σ variable optical system 200 onto an incident surface of the second plural-light-source forming part 104. In the instant embodiment, the second plural-light-source forming part 104 is a fly-eye lens, but includes a secondary light source forming means, such as an optical rod, an optical fiber, an optical integrator formed by two sets of cylindrical lens array plates, and other integrators.

The secondary light source formed by the second plural-light-source forming part 104 is irradiated onto the masking blade 106 by the irradiation optical system 105. The light from the masking blade 106 irradiates a circuit pattern surface of a reticle, which will be described later, by the imaging optical system 107. An object surface or a surface to be illuminated is arranged on the same surface as or on a surface conjugate to the reticle.

A description will now be given of the σ variable optical system 200 in the present invention. FIG. 2 is a simplified optical-path diagram of the σ variable optical system 200 shown in FIG. 1. Referring to FIG. 2, the σ variable optical system 200 of the instant embodiment illustratively arranges a first optical system 210 for continuously varying a σ value, between the first and second plural-light-source forming part 103 and 104, and maintains the exit surface of the first plural-light-source forming part 103 and the incident surface of the second plural-light-source forming part 104 in an approximately imaging relationship. Therefore, a re-condensing position ACP should be taken care of which re-condenses the illumination light, after the illumination light emitted from a secondary light source position TLP as a light source that is located at the incident side of the first plural-light-source forming part 103 enters the first plural-light-source forming part 103.

The first optical system 210 of the instant embodiment for varying the σ value includes, in order from the exit side of the first plural-light-source forming part 103, an aperture stop 211, a parallel plate 212 that can be inserted into and removed from the optical path to change the light intensity distribution of the irradiated area, a first fixed unit 213 of a positive power, a first movable unit 214 of a negative power, a second movable unit 215 of a positive power, and a second fixed unit 216 of a positive power. The first fixed unit 213 includes a convex lens 213a and 213b. The first movable unit 214 includes a concave lens 214a. The second movable unit 215 includes convex lenses 215a and 215b. The second fixed unit 216 includes a concave lens 216a and a convex lens 216b.

In an attempt to enlarge the irradiated area from a small σ side to a large σ side, the first movable unit 214 is moved toward the second plural-light-source forming part 104 (the object surface side) along an optical axis OP to exhibit the zooming operation, and the second movable unit 215 is moved toward the first plural-light-source forming part 103 (the light source side) along the optical axis OP. This configuration substantially maintains constant a back focus position of the σ variable optical system, when the first optical system 210 condenses, at the side of the second plural-light-source forming part 104, the exit light from the light source as an exit edge of the first plural-light-source forming part 103.

The telecentricity or the parallelism to the optical axis OP of a principal ray incident upon the second plural-light-source forming part 104 can be substantially maintained by arranging an afocal optical system that includes, in order from the incident side, the concave lens 216a and the convex lens 216b, as the second fixed unit 216.

The lens unit of a negative power on an incident side that includes the second fixed unit 216 preferably includes the concave lens 216a that is curved more strongly on the incident-side surface than the exit-side surface and has a concave surface on the incident side, in order to maintain the uniformity of the irradiation light incident upon the second plural-light-source forming part 104, to restrain the distortion, especially to restrain the variable amount of the distortion in the zooming range of the large (side.

Figures 2A, 2B:
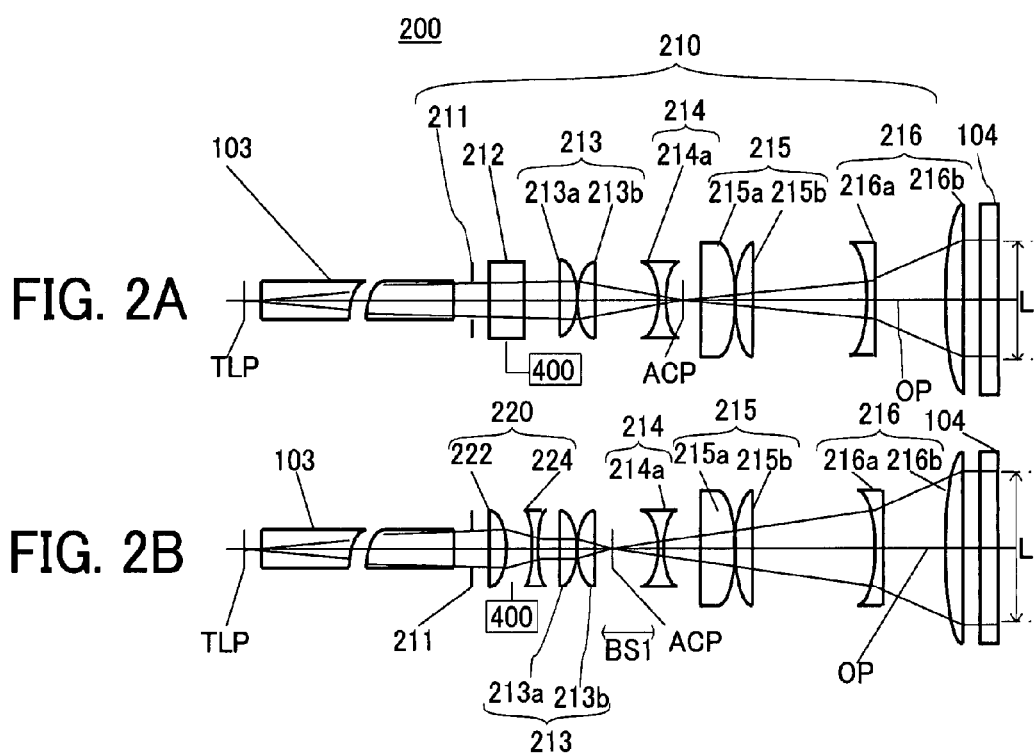
FIG. 2 is a simplified optical-path diagram for a σ variable optical system shown in FIG. 1.

FIG. 2A shows the maximum σ state that provides the largest irradiated area L in the first optical system 210. The maximum σ state re-condenses the irradiation light from the secondary light source position TLP, at a position between the first movable unit 214 of a negative power and the second movable unit 215 of a positive power, and forms the re-condensing position ACP that has the highest light energy density there.

Accordingly, as shown in FIG. 2B, the second optical system 220 that includes the convex lens 222 and the concave lens 224, and has a positive power as a whole is replaced with the parallel plate 212 located on the incident side of the first optical system 210. An arrangement part 400, which will be described later, replaces the parallel plate 212 and the second optical system 220 with each other (or switches between the parallel plate 212 and the second optical system 220 along the optical path of the illumination optical system).

The re-condensing position ACP moves to a space BS1 between the first fixed unit 213 and the first movable unit 214 beyond the first movable unit 214, as shown in FIG. 2, by inserting the second optical system 220 into the optical path. This configuration effectively makes the irradiated area L on the incident surface (or a certain surface) in the second plural-light-source forming part 104 larger than that with the first optical system 210 only (without an insertion of the second optical system 220 into the optical path). In other words, this has an effect in expanding the zooming ratio.

Moreover, a synthetic optical system of the first and second optical systems 210 and 220 (or the σ variable optical system 200 shown in FIG. 2B) can move two movable units (i.e., the first and second movable units 214 and 215) closer to the large σ side, and expand a σ variable range.

Preferably, the exit direction of the principal ray is returned by arranging the convex lens 222 on the side of the first plural-light-source forming part 103 to lower a marginal ray and by arranging the concave lens 224, in order to move the re-condensing position ACP toward the first plural-light-source forming part 103. This configuration shortens a distance from the second optical system 220 to the re-condensing position ACP, even with a small space for the second optical system 220.

Figure 3:
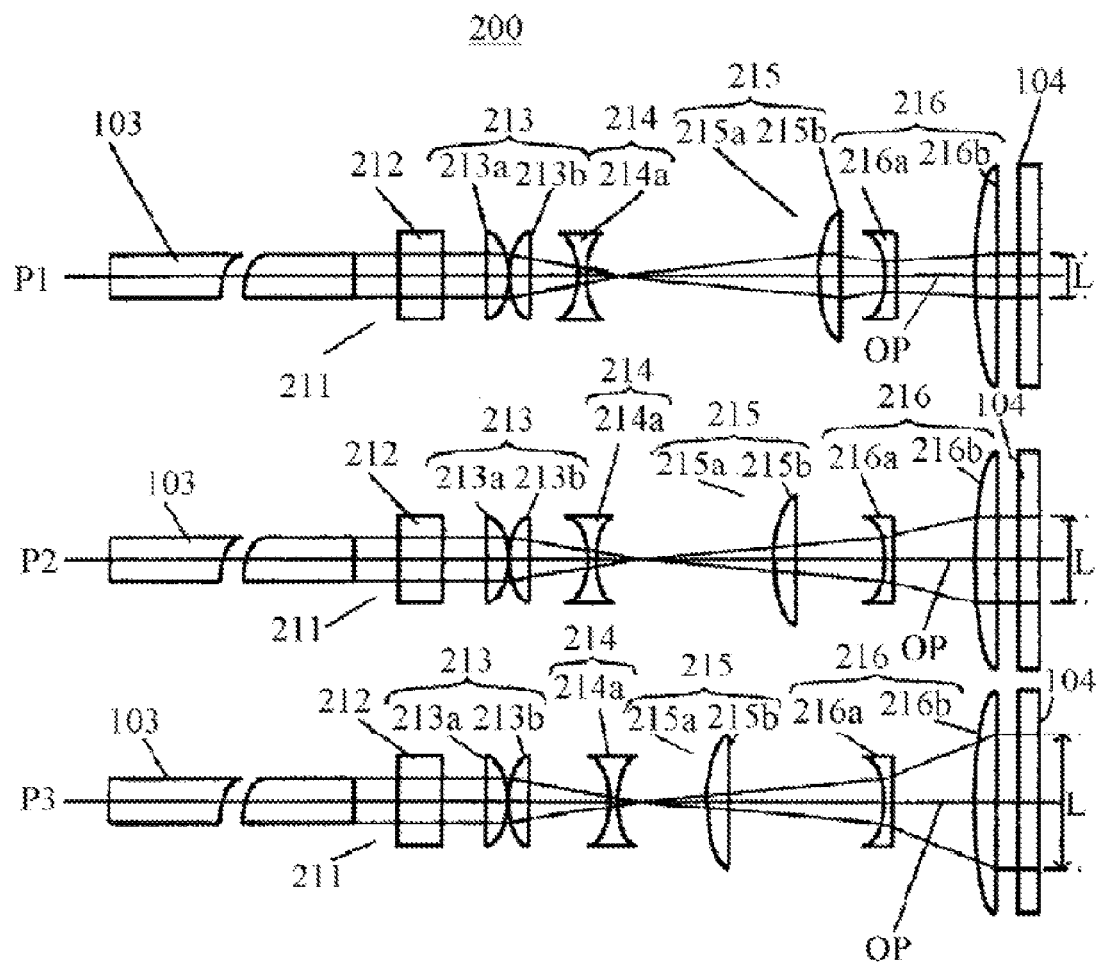
FIG. 3 is an optical path that shows a minimum σ state, a intermediate σ state and a maximum σ state in the σ variable optical system shown in FIG. 2.

Table 1 shows the specification of the first optical system 210 of the instant embodiment. In Table 1, P1, P2 and P3 indicate, as shown in FIG. 3, the σ variable optical system 200 in the minimum σ state with the smallest irradiated area L, the σ variable optical system 200 in the intermediate σ state in which the irradiated area L is between the minimum σ state and the maximum σ state, and the σ variable optical system 200 in the maximum σ state with the largest irradiated area L. F1 is a focal length in each of the states P1 to P3 in the first optical system 210. f1 is a focal length of the first fixed unit 213 in the first optical system 210. f2 is a focal length of the first movable unit 214 in the first optical system 210. f3 is a focal length of the second movable unit 215 in the first optical system 210. Here, FIG. 3 is an optical-path diagram that shows the maximum σ state, the intermediate σ state and the maximum σ state of the σ variable optical system 200 shown in FIG. 2.

TABLE 1

SPECIFICATION OF THE FIRST OPTICAL SYSTEM $\lambda = 0.248$ μm, APERTURE-STOP DIAMETER = 10 mm, INCIDENT NA = 0.1

|  | r | d | n | k |
|---|---|---|---|---|
| 1: | APERTURE STOP | 17.3 | 1 | |
| 2: | ∞ | 59.8 | 1.508456 | 212 |
| 3: | ∞ | 20.3 | 1 | |
| 4: | ∞ | 21.1 | 1.508456 | 213a |
| 5: | −51.67880 | 0.5 | 1 | |
| 6: | 67.93790 | 18.4 | 1.508456 | 213b |
| 7: | ∞ | d7: VARIABLE | 1 | |
| 8: | −40.08378 | 4.5 | 1.508456 | 214a |
| 9: | 64.15514 | d9: VARIABLE | 1 | |
| 10: | ∞ | 27.0 | 1.508456 | 215a |
| 11: | −78.73668 | 0.5 | 1 | |
| 12: | 73.17649 | 19.3 | 1.508456 | 215b |
| 13: | 147.70793 | d13: VARIABLE | 1 | |
| 14: | −59.72408 | 5.8 | 1.508456 | 216a |
| 15: | −703.48443 | 207.0 | 1 | |
| 16: | 187.48807 | 26.4 | 1.508456 | 216b |
| 17: | ∞ | 67.0 | 1 | |
| EVALUATION PLANE: | ∞ | | | |

FOCAL LENGTH AND THE VARIABLE INTERVAL OF EACH STATE

| | P1 | P2 | P3 |
|---|---|---|---|
| F1 | 12292.2 | 454.6 | 159.4 |
| d7 | 27.0 | 33.2 | 48.0 |
| d9 | 118.1 | 70.4 | 18.3 |
| d13 | 54.5 | 96.0 | 133.3 |
| S1 | 26.0 | 43.8 | 94.0 |

FOCAL LENGTHS BETWEEN UNITS f1 = +57.85 mm
f2 = −47.90 mm
f3 = +94.86 mm

RE-CONDENSING POSITION (DISTANCE FROM THE NINTH PLANE)

H1 = 60.29 mm
H2 = 35.25 mm
H3 = 5.22 mm

In the specification shown in Table 1, d7 is a variable interval along the optical axis OP between the first fixed unit 213 and the first movable unit 214, d9 is a variable interval along the optical axis OP between the first movable unit 214 and the second movable unit 215, and d13 is a variable interval along the optical axis OP between the second movable unit 215 and the second fixed unit 216.

S1 is a diameter of light incident upon an evaluation surface located apart from the final plane of the first optical system 210 by 67 mm after entering as parallel light the aperture stop 211 of diameter $\phi 10$ mm and passing through the first optical system 210.

H1, H2 and H3 are distances between the re-condensing position ACP at which the exit light from the secondary light source TLP condenses in each of the states P1 to P3, and a ninth surface as an exit-side surface of the concave lens 214a, where the length of the first plural-light-source forming part 103 is 450 mm, and a distance from the secondary light source TLP to the incident edge of the first plural-light-source forming part 103 is 15 mm.

r is a radius of curvature (unit: mm) in each plane. d is a plane interval (unit: mm). n is a refractive index of a medium to the incidence light (with a wavelength of 0.248 μm). k corresponds to the lens number of the first optical system 210 shown in FIG. 2.

Figures 5A, 5B, 5C:
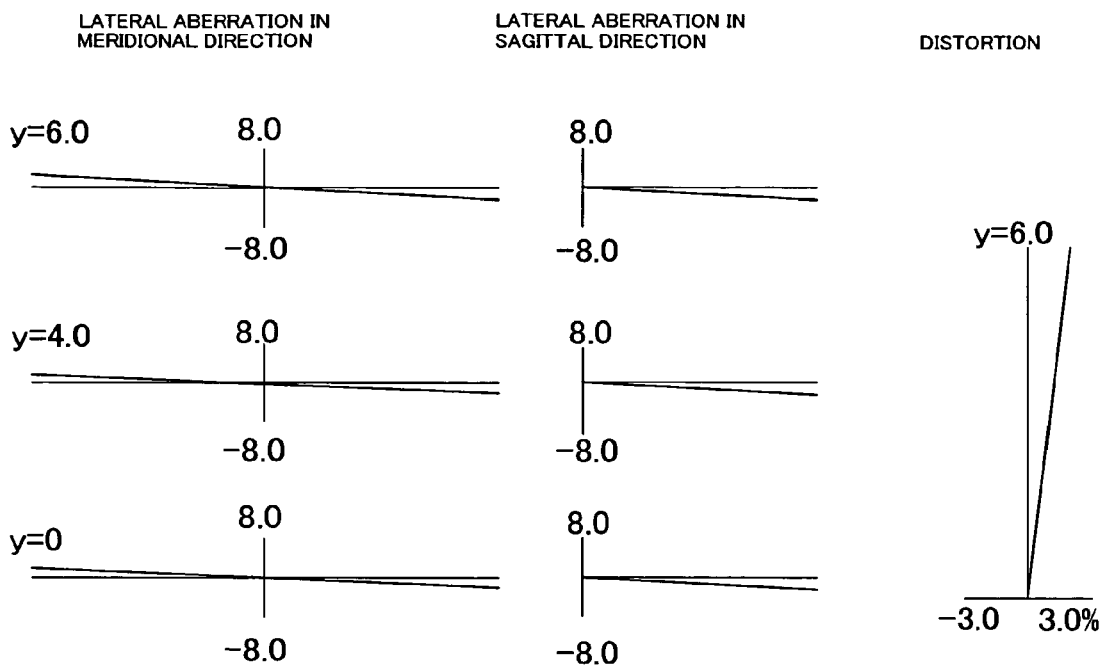
FIG. 5 is an aberrational diagram of the first optical system shown in FIG. 3 in the maximum σ state.

FIG. 4 is an aberrational diagram of the first optical system 210 shown in FIG. 3 in the minimum σ state P1. More specifically, FIG. 4A is a lateral aberration diagram in the meridional direction of the first optical system 210 in the minimum σ state P1. FIG. 4B is a lateral aberration diagram in the sagittal direction. FIG. 4C is a distortion diagram. FIG. 5 is an aberrational diagram of the first optical system 210 shown in FIG. 3 in the maximum σ state P3. More specifically, FIG. 5A is a lateral aberration diagram in the meridional direction of the first optical system 210 in the maximum σ state P3. FIG. 5B is a lateral aberration diagram in the sagittal direction. FIG. 5C is a distortion diagram. FIGS. 4 and 5 show the lateral aberration that has reduced to a permissible range and properly corrected distortion.

Figure 6:
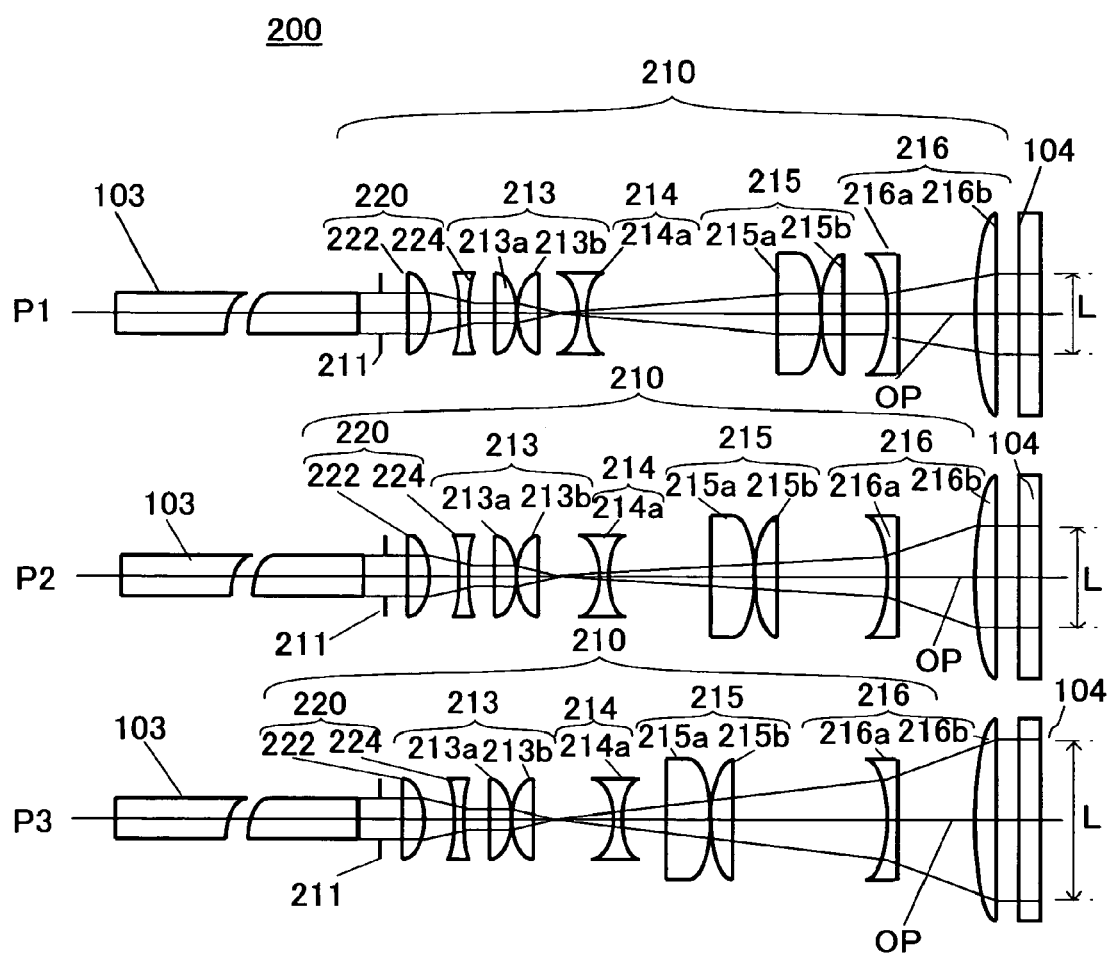
FIG. 6 is an optical-path diagram when the first optical system shown in FIG. 3 uses a second optical system instead of a parallel plate.

FIG. 6 is an optical-path diagram when the second optical system 220 is arranged instead of the parallel plate 212 in the first optical system 210 shown in FIG. 3 (in the synthetic optical system of the first and second optical systems 210 and 220). Table 2 shows the specification of the synthetic optical system of the first and second optical systems 210 and 220.

TABLE 2

SPECIFICATION OF THE FIRST OPTICAL SYSTEM
AND THE SECOND OPTICAL SYSTEM

λ = 0.248 μm, APERTURE-STOP DIAMETER = 10 mm,
INCIDENT NA = 0.1

|   | r | d | n | k |
|---|---|---|---|---|
| 1: | APERTURE STOP | 12.0 | 1 | |
| 2: | −43.75328 | 9.5 | 1.508456 | 222 |
| 3: | −24.27205 | 14.0 | 1 | |
| 4: | ∞ | 32.0 | 1.508456 | 224 |
| 5: | 236.4047 | 29.9 | 1 | |
| 6: | ∞ | 21.1 | 1.508456 | 213a |
| 7: | −51.67880 | 0.5 | 1 | |
| 8: | 67.93790 | 19.1 | 1.508456 | 213b |
| 9: | ∞ | d9: VARIABLE | 1 | |
| 10: | −40.08378 | 4.0 | 1.508456 | 214a |
| 11: | 64.15514 | d11: VARIABLE | 1 | |
| 12: | ∞ | 27.0 | 1.508456 | 215a |
| 13: | −78.73668 | 0.5 | 1 | |
| 14: | 73.17649 | 19.3 | 1.508456 | 215b |
| 15: | 147.70793 | d15: VARIABLE | 1 | |
| 16: | −59.72408 | 5.8 | 1.508456 | 216a |
| 17: | −703.48443 | 207.0 | 1 | |
| 18: | 187.48807 | 26.4 | 1.508456 | 216b |
| 19: | ∞ | 67.0 | 1 | |
| EVALUATION PLANE: | ∞ | | | |

FOCAL LENGTH AND THE VARIABLE
INTERVAL OF EACH STATE

|   | P1 | P2 | P3 |
|---|---|---|---|
| F12 | −281.8 | 2386.7 | 153.5 |
| d9 | 27.0 | 33.2 | 48.0 |
| d11 | 18.1 | 70.4 | 18.3 |
| d15 | 54.5 | 96.0 | 133.3 |
| S2 | 30.8 | 50.3 | 112.2 |
| S2/S1 | 1.18 | 1.15 | 1.19 |

FOCAL LENGTHS BETWEEN UNITS f1 = +57.85 mm
f2 = −47.90 mm
f3 = +94.86 mm

TABLE 2-continued

SPECIFICATION OF THE FIRST OPTICAL SYSTEM
AND THE SECOND OPTICAL SYSTEM

THE SECOND OPTICAL SYSTEM FOCAL LENGTH

F2 = +106.67 mm

RE-CONDENSING POSITION (DISTANCE FROM THE NINTH PLANE):

H = 21.1 mm (ALL POSITION)

In Table 2, P1, P2 and P3 are, as shown in FIG. 6, the σ variable optical system 200 (or the synthetic optical system of the first and second optical systems 210 and 220) in the minimum σ state with the smallest irradiated area L, the σ variable optical system 200 in the intermediate σ state in which the irradiated area L is between the minimum σ state and the maximum σ state, and the σ variable optical system 200 in the maximum σ state with the largest irradiated area L. F2 is a focal length of the second optical system 220. F12 is a focal length in each of the states P1 to P3 in the synthetic optical system of the first and second optical systems 210 and 220. f1 is a focal length of the first fixation optical system 213 in the first optical system 210. f2 is a focal length of the first movable unit 214 in the first optical system 210. f3 is a focal length of the second movable unit 215 in the first optical system 210.

In the specification shown in Table 2, d9 is a variable interval along the optical axis OP between the first fixed unit 213 and the first movable unit 214, d11 is a variable interval along the optical axis OP between the first movable unit 214 and the second movable unit 215, and d15 is a variable interval along the optical axis OP between the second movable unit 215 and the second fixed unit 216.

S2 is a diameter of light incident upon an evaluation surface located apart from the final plane of the synthetic optical system by 67 mm after entering as parallel light the aperture stop 211 of diameter φ10 mm and passing through the synthetic optical system of the first and second optical systems 210 and 220. S1/S2 is an expansion ratio of the irradiated area, and an average expansion ratio of the irradiated area is 1.17 times.

H1, H2 and H3 show distances between the re-condensing position ACP at which the exit light from the secondary light source TLP condenses in each states P1 to P3, and an eleventh surface as an exit-side surface of the convex lens 213b, where the length of the first plural-light-source forming part 103 is 450 mm and a distance from the secondary light source TLP to the incident edge of the first plural-light-source forming part 103 is 15 mm. This configuration arranges the re-condensing position ACP in the space between the first fixed unit 213 and the first movable unit 214 beyond the first movable unit 214 by arranging the second optical system 220 on the incident side. This can move closer the two movable units, i.e., the first movable unit 214 and the second movable unit 215, and increase the zooming ratio by increasing the moving amount of the movable unit.

r is a radius of curvature (unit: mm) in each plane. d is a plane interval (unit: mm). n is a refractive index of a medium to the incidence light (with a wavelength of 0.248 μm). k corresponds to the lens number of the synthetic optical system of the first and second optical systems 210 and 220 shown in FIG. 6.

Figures 7A, 7B, 7C:
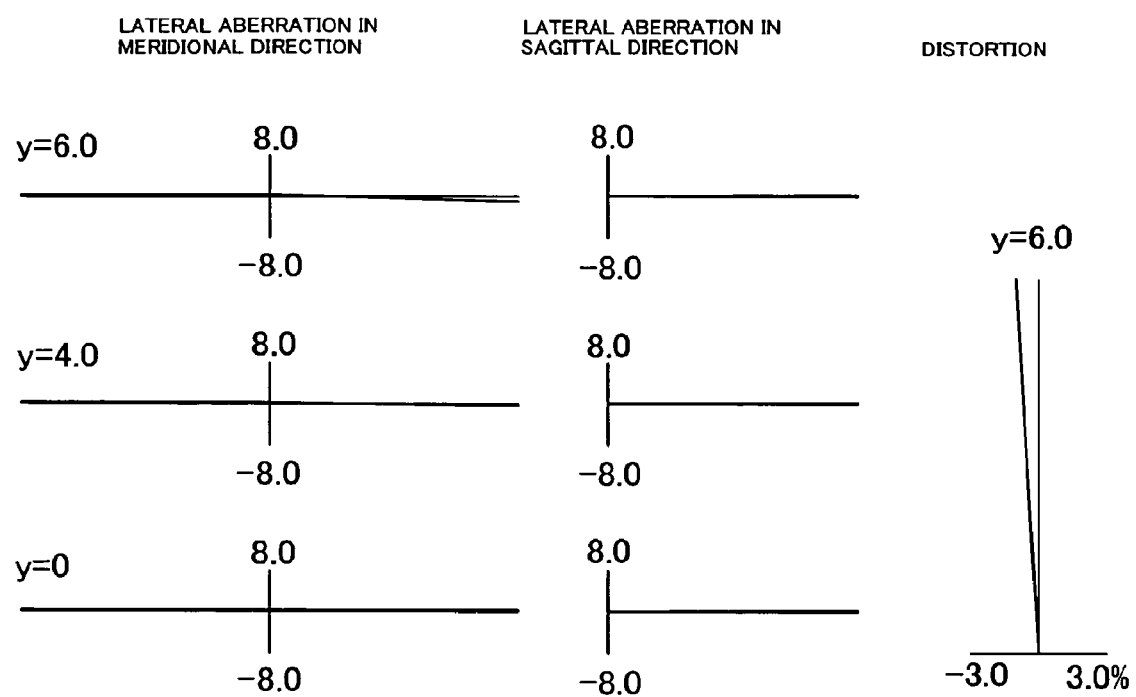
FIG. 7 is an aberrational diagram of a synthetic optical system of the first and second optical systems shown in FIG. 6 in the minimum σ state.
Figures 8A, 8B, 8C:
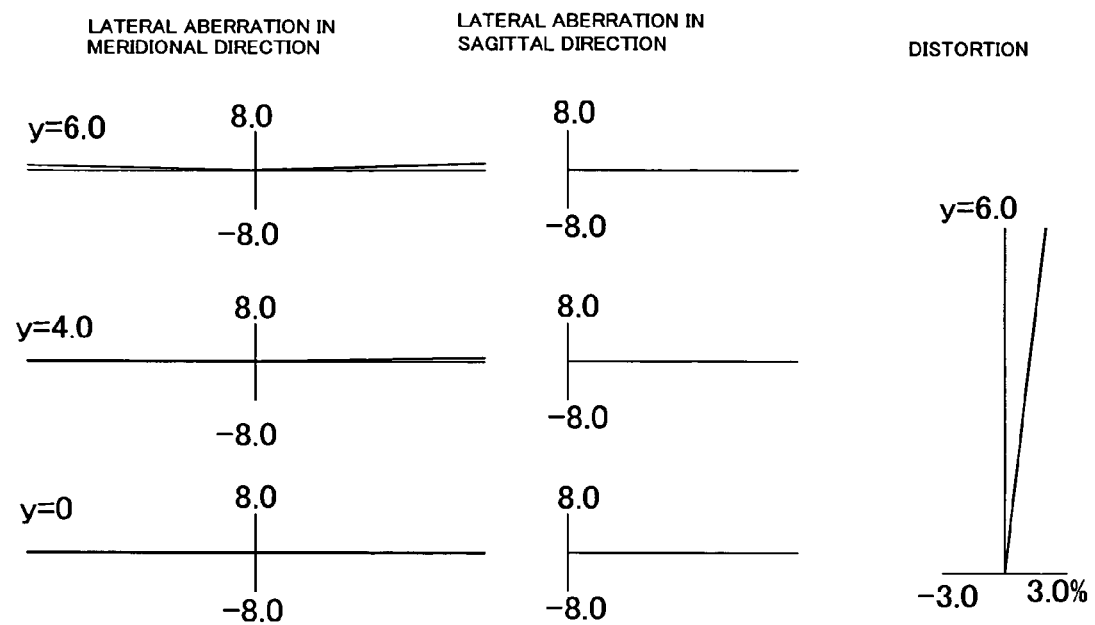
FIG. 8 is an aberrational diagram of the synthetic optical system of the first and second optical systems in the maximum σ state.

FIG. 7 is an aberrational diagram of the synthetic optical system between the first and second optical systems 210 and 220 shown in FIG. 6 in the minimum σ state P1. More specifically, FIG. 7A is a lateral aberration diagram in the meridional direction of the synthetic optical system in the minimum σ state P1, FIG. 7B is its lateral aberration diagram in the sagittal direction, and FIG. 7C is its distortion diagram. FIG. 8 is an aberrational diagram of the synthetic optical system of the first and second optical systems 210 and 220 shown in FIG. 6 in the maximum σ state P3. More specifically, FIG. 8A is a lateral aberration diagram in the meridional direction of the synthetic optical system in the maximum σ state P3, FIG. 8B is its lateral aberration diagram in the sagittal direction, and FIG. 8C is its distortion diagram. FIGS. 7 and 8 show that the lateral aberration that has substantially reduced to a permissible range, and properly corrected distortion.

The σ variable optical system 200 of the instant embodiment can expand the variable range of the irradiated area by the exit light by arranging the second optical system 220 on the incident side while using the first optical system 210 as the simplest zooming optical system that includes two movable units. Moreover, the σ variable optical system 200 can reduce the lateral aberration to a substantially permissible range, correct the distortion properly without the re-condensing position in the optical element, and maintain the telecentricity of the exit light from the σ variable optical system 200 within a substantially permissible range.

A description will now be given of a σ variable optical system 300 as a variation of the σ variable optical system 200, referring to FIG. 9. FIG. 9 is a simplified optical-path diagram of the σ variable optical system 300 as a variation of the σ variable optical system 200 shown in FIG. 2.

Referring to FIG. 9, the σ variable optical system 300 of the instant embodiment illustratively arranges a first optical system 310 for continuously varying a σ value, between a first plural-light-source forming part 301 and the second plural-light-source forming part 104, and the first and second plural-light-source forming part 301 and 104 have substantially the Fourier transform relationship. The first plural-light-source forming part 301 is a fly-eye lens in the instant embodiment, but includes other well-known secondary light source forming means. Therefore, a re-condensing position ACP should be taken care of which re-condenses the illuminating light, after the illumination light from condensed light as a light source just behind the first plural-light-source forming part 301 enters the first optical system 310.

The first optical system 310 of the σ variable optical system 300 to vary the σ value includes, in order from the exit side of the first plural-light-source forming part 301, an aperture stop 311, a first fixed unit 313 of a positive power, a second fixed unit 314 of a positive power, a first movable unit 315 of a negative power, a second movable unit 316 of a positive power, and a third fixed unit 317 of a positive power.

The first fixed unit 313 includes convex lenses 313a and 313b. The second fixed unit 314 includes convex lenses 314a and 314b. The first movable unit 315 includes a concave lens 315a. The second movable unit 316 includes convex lenses 316a and 316b. The third fixed unit 317 includes a concave lens 317a and a convex lens 317b.

In an attempt to enlarge the irradiated area from a small σ side to a large σ side, the first movable unit 313 is moved toward the second plural-light-source forming part 104 along the optical axis OP and to exhibit the zooming function, and the second movable unit 316 is moved toward the first plural-light-source forming part 301 along the optical axis OP. This configuration substantially maintains a back focus position within a substantially permissible range, when the first optical system 210 condenses, at the side of the second plural-light-source forming part 104, the parallel light incident upon the aperture stop 311 that is located at the exit edge of the first plural-light-source forming part 301.

The telecentricity of the ray incident upon the second plural-light-source forming part 104 is maintained within a substantially permissible range by arranging an a focal optical system that includes, in order from the incident side, the concave lens 317a and the convex lens 317b, as the third fixed unit 317.

The lens unit of a negative power on an incident side that includes the third fixed unit 317 preferably includes the concave lens 317a that is curved more strongly on the incident-side surface than the exit-side surface and has a concave surface on the incident side, in order to maintain the uniformity of the irradiation light incident upon the second plural-light-source forming part 104, to restrain the distortion, especially to restrain the variable amount of the distortion in the zooming range of the large σ side.

FIG. 9A shows the maximum σ state with the largest irradiated area L in the first optical system 310. The maximum σ state re-condenses the irradiation light resulting from the condensed light as a light source just behind the first plural-light-source forming part 301, at a position between the first movable unit 315 of a negative power and the second movable unit 316 of a positive power, and forms the re-condensing position ACP that has the highest light energy density there.

Accordingly, as shown in FIG. 9B, a second optical system 320 that includes a concave lens 322 and a convex lens 324, and has a positive power as a whole is arranged in between the first fixed unit 313 and the second fixed unit 314 in the first optical system 310. The arrangement part 400, which will be described later, arranges the second optical system 320 along the optical path.

The re-condensing position ACP moves to a space BS2 between the second fixed unit 314 and the first movable unit 315 beyond the first movable unit 315, as shown in FIG. 2, by the second optical system 320. This configuration effectively makes the irradiated area L of the second plural-light-source forming part 104 larger than that with the first optical system 310 only.

Moreover, in a synthetic optical system of the first and second optical systems 310 and 320 (or the σ variable optical system 300 shown in FIG. 9B) can move two movable units (i.e., the first and second movable units 315 and 316) closer to the large σ side, and expand a σ variable range.

Preferably, the exit direction of the principal ray is returned by arranging the convex lens 324 on the side that the first plural-light-source forming part 301 to heighten a marginal ray and by arranging the concave lens 322, in order to move the re-condensing position ACP toward the first plural-light-source forming part 301. This configuration enhances the refraction effect by the convex lens 324, shortens a distance from the second optical system 320 to the re-condensing position ACP, and provides the convex lens 324 with a comparatively loose power, even with a small space for the second optical system 320.

Figure 10:
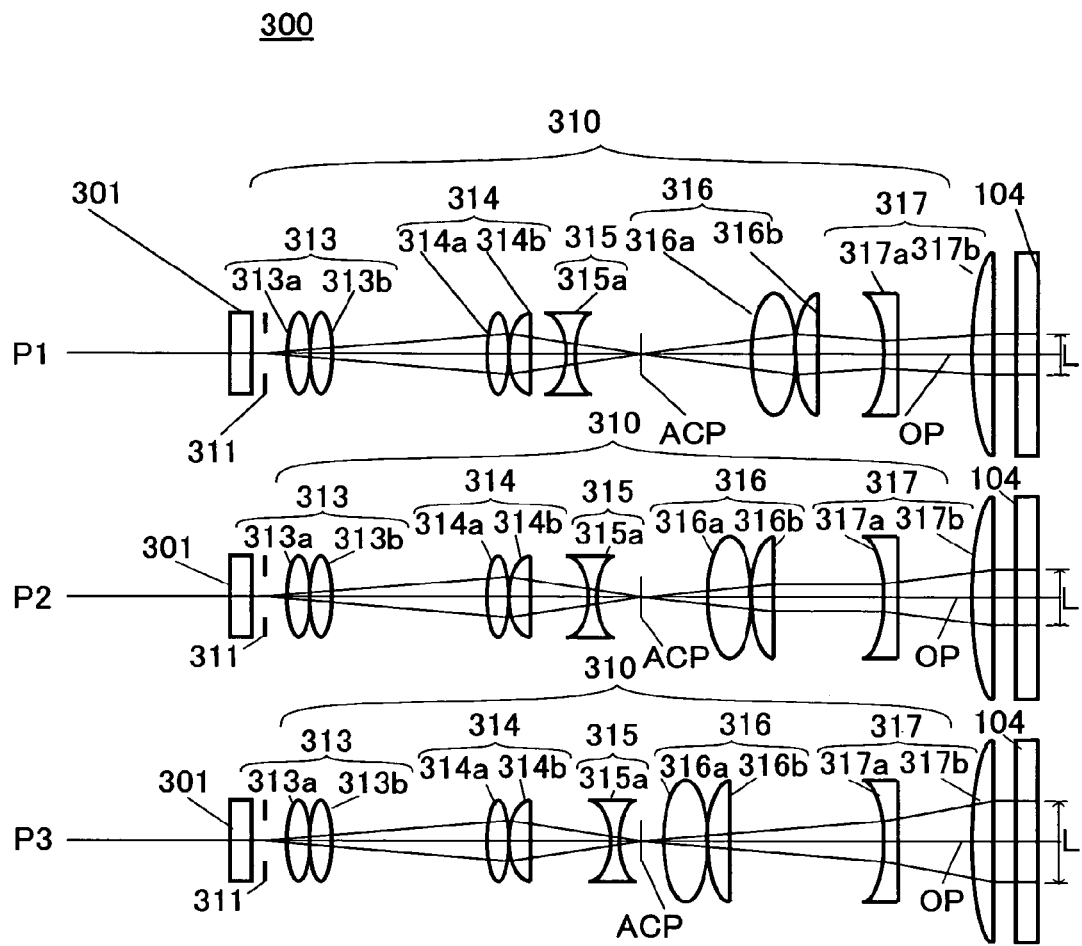
FIG. 10 is an optical-path diagram that shows a minimum σ state, a intermediate σ state and a maximum σ state of the σ variable optical system shown in FIG. 9.

Table 3 shows the specification of the first optical system 310 of the instant embodiment. In Table 3, P1, P2 and P3 indicate, as shown in FIG. 10, the σ variable optical system 300 in the minimum σ state with the smallest irradiated area L, the σ variable optical system 300 in the intermediate σ state in which the irradiated area L is between the minimum σ state and the maximum σ state, and the σ variable optical system 300 in the maximum σ state with the largest irradiated area L. F1 is a focal length in each of the states P1 to P3 in the first optical system 310. f1 is a focal length of the first fixed unit 313 in the first optical system 310. f2 is a focal length of the second fixed unit 314 in the first optical system 310. f3 is a focal length of the first movable unit 315 in the first optical system 310. f4 is a focal length of the second movable unit 316 in the first optical system 310. Here, FIG. 10 is an optical-path diagram that shows the maximum σ state, the intermediate σ state, and the maximum σ state of the σ variable optical system 300 shown in FIG. 9.

TABLE 3

SPECIFICATION OF THE FIRST OPTICAL SYSTEM

λ = 0.193 μm, APERTURE-STOP DIAMETER = 12 mm,
THE MAXIMUM ANGLE OF THE INCIDENT BEAM TO THE
APERTURE STOP (HALF ANGLE) = 5.7°

|    | r           | d            | n        | k    |
|----|-------------|--------------|----------|------|
| 1: | APERTURE STOP | 15.1       | 1        |      |
| 2: | 174.61808   | 22.0         | 1.504132 | 313a |
| 3: | −49.88733   | 0.5          | 1        |      |
| 4: | 82.47264    | 14.0         | 1.501432 | 313b |
| 5: | −144.28045  | 106.9        | 1        |      |
| 6: | 113.20000   | 36.0         | 1.501432 | 314a |
| 7: | −70.00000   | 1.0          | 1        |      |
| 8: | 70.00000    | 30.0         | 1.501432 | 314b |
| 9: | −6789.50000 | d9: VARIABLE | 1        |      |
| 10:| −49.56023   | 4.5          | 1.501432 | 315a |
| 11:| 51.02448    | d11: VARIABLE| 1        |      |
| 12:| 146.36947   | 42.0         | 1.501432 | 316a |
| 13:| −115.11405  | 0.5          | 1        |      |
| 14:| 76.07736    | 20.0         | 1.501432 | 316b |
| 15:| 114.68230   | d15: VARIABLE| 1        |      |
| 16:| −58.38708   | 6.0          | 1.501432 | 317a |
| 17:| −450.67883  | 207.0        | 1        |      |
| 18:| 194.39885   | 30.7         | 1.501432 | 317b |
| 19:| ∞           | 69.5         | 1        |      |
| EVALUATION PLANE: | ∞ |           |          |      |

FOCAL LENGTH AND THE VARIABLE INTERVAL OF EACH STATE

|     | P1     | P2     | P3     |
|-----|--------|--------|--------|
| F1  | −169.2 | −316.0 | −542.7 |
| d9  | 28.0   | 34.4   | 41.8   |
| d11 | 106.5  | 57.0   | 30.0   |
| d15 | 54.2   | 97.3   | 116.9  |
| S1  | 33.0   | 58.2   | 84.6   |

FOCAL LENGTHS BETWEEN UNITS f1 = +47.62 mm
f2 = +58.15 mm
f3 = −49.40 mm
f4 = +98.65 mm

RE-CONDENSING POSITION (DISTANCE FROM THE ELEVENTH PLANE)

H1 = 41.0 mm
H2 = 23.2 mm
H3 = 9.6 mm

In the specification shown in Table 3, d9 is a variable interval along the optical axis OP between the second fixed unit 314 and the first movable unit 315, d11 is a variable interval along the optical axis OP between the first movable unit 315 and the second movable unit 316, and d15 is a variable interval along the optical axis OP between the second movable unit 316 and the third fixed unit 317.

S1 is a diameter of light incident upon an evaluation surface located apart from the final plane of the first optical system 310 by 69.5 mm after exiting, as divergent light of numerical aperture (NA) 0.1, the aperture stop 311 and passing through the first optical system 310.

H1, H2 and H3 are distances between the re-condensing position ACP at which the illuminating light from the condensed light as a light source just behind the first plural-light-source forming part 301 enters the first optical system 310 and re-condenses, and an eleventh surface as an exit-side surface of the concave lens 315a.

r is a radius of curvature (unit: mm) in each plane. d is a plane interval (unit: mm). n is a refractive index of a medium to the incidence light (with a wavelength of 0.248 μm). k corresponds to the lens number of the first optical system 310 shown in FIG. 9.

Figures 11A, 11B, 11C:
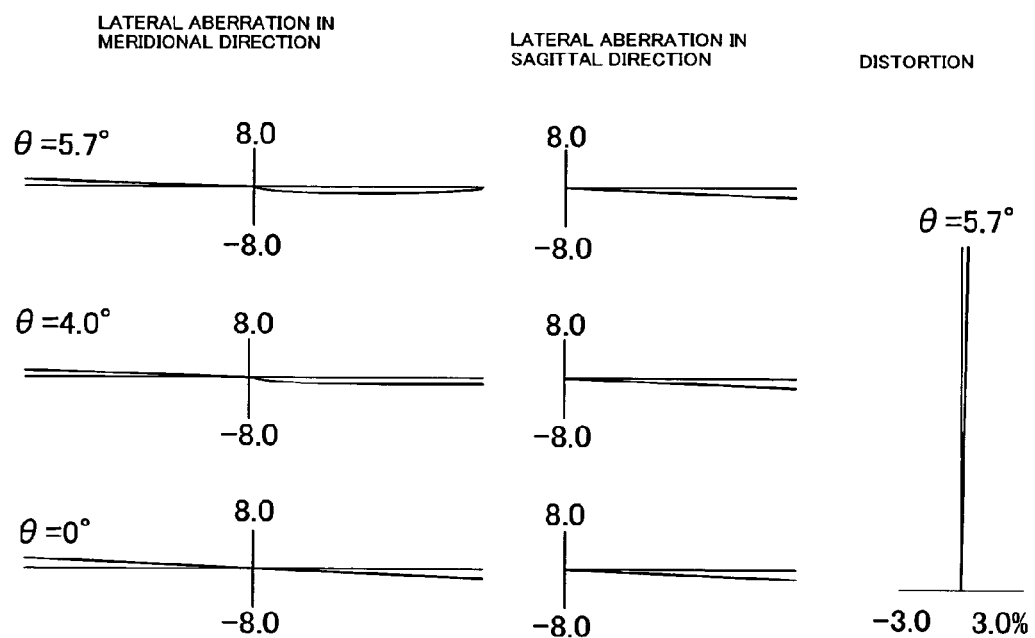
FIG. 11 is an aberrational diagram of a first optical system shown in FIG. 10 in the minimum σ state.

FIG. 11 is an aberrational diagram of the first optical system 310 shown in FIG. 10 in the minimum σ state P1. More specifically, FIG. 11A is a lateral aberration diagram in the meridional direction of the first optical system 310 in the minimum σ state P1, FIG. 11B is a lateral aberration diagram in the sagittal direction, and FIG. 11C is a distortion diagram.

Figures 12A, 12B, 12C:
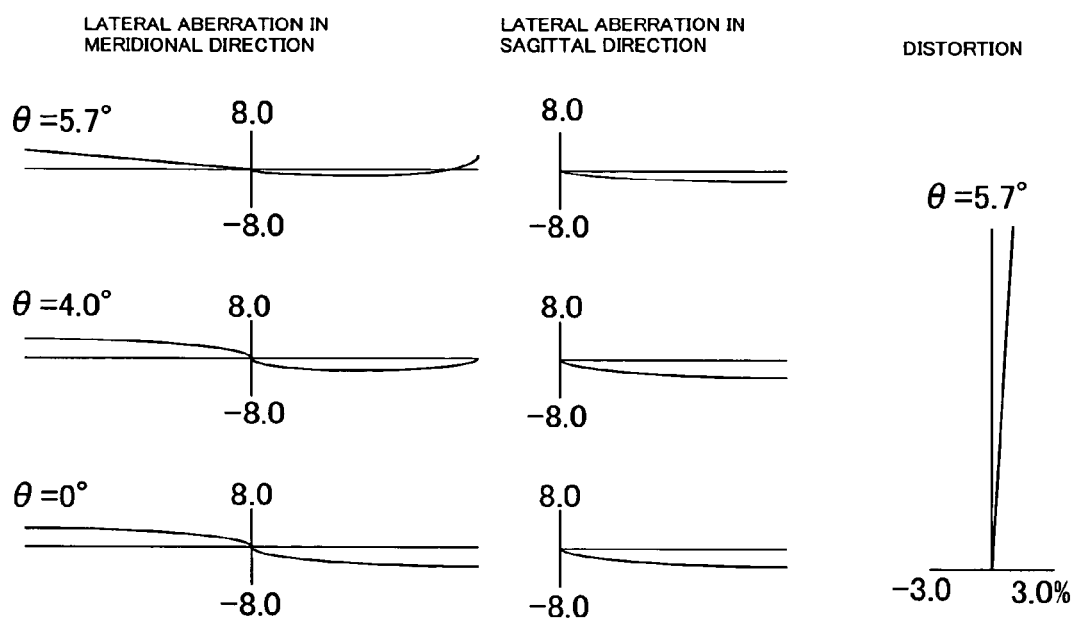
FIG. 12 is an aberrational diagram of the first optical system shown in FIG. 10 in the maximum σ state.

FIG. 12 is an aberrational diagram of the first optical system 310 shown in FIG. 10 in the maximum σ state P3. More specifically, FIG. 12A is a lateral aberration diagram in the meridional direction of the first optical system 310 in the maximum σ state P3, FIG. 12B is a lateral aberration diagram in the sagittal direction, and FIG. 12C is a distortion diagram. FIGS. 11 and 12 show the lateral aberration that has reduced to a permissible range and properly corrected distortion.

Figure 13:
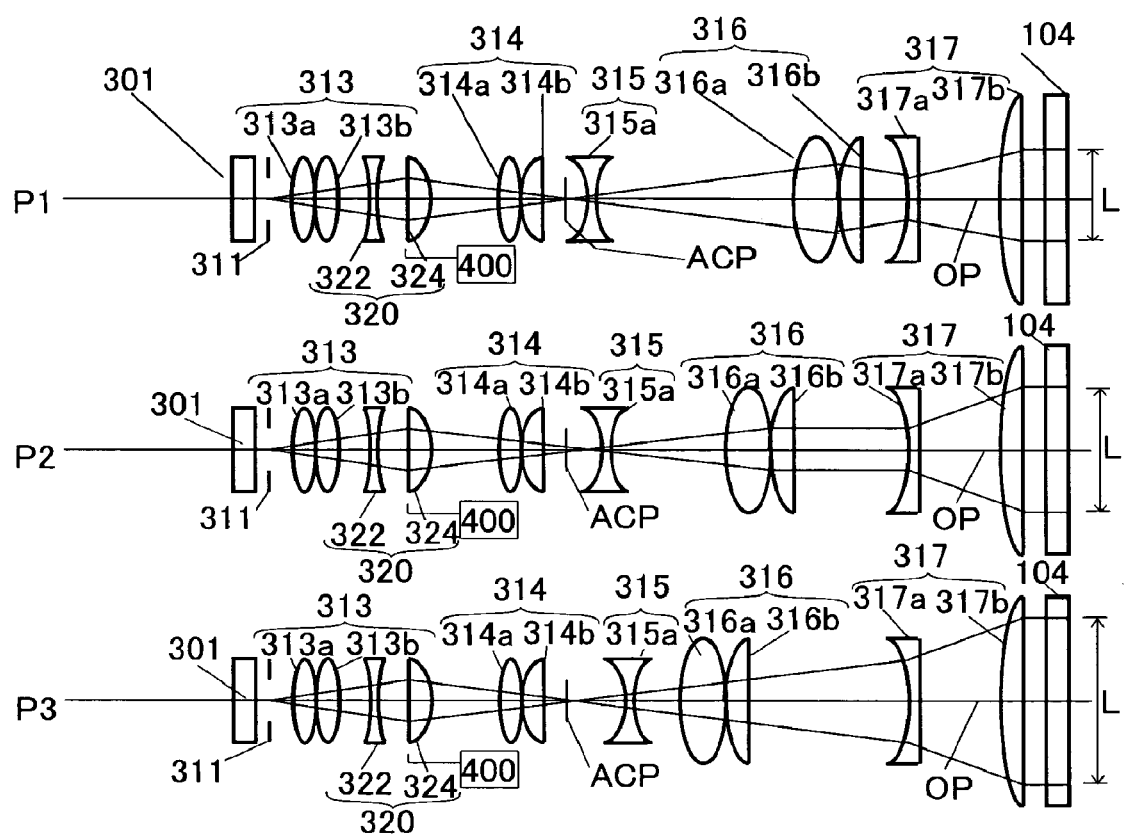
FIG. 13 is an optical-path diagram that arranges a second optical system in the optical path between a first fixed unit and a second fixed unit in the first optical system shown in FIG. 10.

FIG. 13 is an optical-path diagram when the second optical system 320 is arranged along the optical path between the first and second fixed units 313 and 314 in the first optical system 310 shown in FIG. 10 (in the synthetic optical system of the first and second optical system 310 and 320). Table 4 shows the specification of the synthetic optical system of the first and second optical systems 310 and 320.

TABLE 4

SPECIFICATION OF THE FIRST OPTICAL SYSTEM
AND THE SECOND OPTICAL SYSTEM

λ = 0.193 μm, APERTURE-STOP DIAMETER = 12 mm,
THE MAXIMUM ANGLE OF THE INCIDENT BEAM TO THE
APERTURE STOP (HALF ANGLE) = 5.7°

|     | r           | d             | n        | k    |
|-----|-------------|---------------|----------|------|
| 1:  | APERTURE STOP | 15.1       | 1        |      |
| 2:  | 174.61808   | 22.0          | 1.504132 | 313a |
| 3:  | −49.88733   | 0.5           | 1        |      |
| 4:  | 82.47264    | 14.0          | 1.501432 | 313b |
| 5:  | −144.28045  | 12.9          | 1        |      |
| 6:  | −70.00000   | 5.0           | 1.501432 | 322  |
| 7:  | ∞           | 31.0          | 1        |      |
| 8:  | ∞           | 24.0          | 1.501432 | 324  |
| 9:  | −35.00000   | 34.0          | 1        |      |
| 10: | 113.20000   | 36.0          | 1.501432 | 314a |
| 11: | −70.00000   | 1.0           | 1        |      |
| 12: | 70.00000    | 30.0          | 1.501432 | 314b |
| 13: | −6789.50000 | d13: VARIABLE | 1        |      |
| 14: | −49.56023   | 4.5           | 1.501432 | 315a |
| 15: | 51.02448    | d15: VARIABLE | 1        |      |
| 16: | 146.36947   | 42.0          | 1.501432 | 316a |
| 17: | −115.11405  | 0.5           | 1        |      |
| 18: | 76.07736    | 20.0          | 1.501432 | 316b |
| 19: | 114.68230   | d19: VARIABLE | 1        |      |
| 20: | −58.38708   | 6.0           | 1.501432 | 317a |
| 21: | −450.67883  | 207.0         | 1        |      |
| 22: | 194.39885   | 30.7          | 1.501432 | 317b |
| 23: | ∞           | 69.5          | 1        |      |

TABLE 4-continued

SPECIFICATION OF THE FIRST OPTICAL SYSTEM
AND THE SECOND OPTICAL SYSTEM

| EVALUATION PLANE: | ∞ | | |
|---|---|---|---|

FOCAL LENGTH AND THE VARIABLE
INTERVAL OF EACH STATE

| | P1 | P2 | P3 |
|---|---|---|---|
| F12 | −290.7 | −630.7 | −1616.1 |
| d13 | 28.0 | 34.4 | 41.8 |
| d15 | 106.5 | 57.0 | 30.0 |
| d19 | 54.2 | 97.3 | 116.9 |
| S2 | 59.4 | 104.6 | 157.4 |
| S2/S1 | 1.80 | 1.80 | 1.86 |

FOCAL LENGTHS BETWEEN UNITS f1 = +47.62 mm
f2 = +58.15 mm
f3 = −49.40 mm
f4 = +98.65 mm

THE SECOND OPTICAL SYSTEM FOCAL LENGTH

F2 = +81.12 mm

RE-CONDENSING POSITION (DISTANCE FROM THE THIRTEENTH PLANE):

H = 13.9 mm (ALL POSITION)

In Table 4, P1, P2 and P3 are, as shown in FIG. 13, the σ variable optical system 300 (or the synthetic optical system of the first and second optical systems 310 and 320) in the minimum σ state with the smallest irradiated area L, the σ variable optical system 300 in the intermediate σ state in which the irradiated area L is between the minimum σ state and the maximum σ state, and the σ variable optical system 300 in the maximum σ state with the largest irradiated area L. F2 is a focal length of the second optical system 320. F12 is a focal length in each of the states P1 to P3 of the synthetic optical system of the first and second optical systems 310 and 320. f1 is a focal length of the first fixation optical system 313 in the first optical system 310. f2 is a focal length of the second fixed unit 314 in the first optical system 310. f3 is a focal length of the first movable unit 315 in the first optical system 310. f4 is a focal length of the second movable unit 316 in the first optical system 310.

In the specification shown in Table 4, d13 is a variable interval along the optical axis OP between the second fixed unit 314 and the first movable unit 315, d15 is a variable interval along the optical axis OP between the first movable unit 315 and the second movable unit 316, and d19 is a variable interval along the optical axis OP between the second movable unit 316 and the third fixed unit 317.

S2 is a diameter of light incident upon an evaluation surface located apart from the final plane of the synthetic optical system of the first and second optical systems 310 and 320 by 69.5 mm after exiting, as divergent light of numerical aperture (NA) 0.1, the aperture stop 311 and passing through the synthetic optical system. S1/S2 is an expansion ratio of the irradiated area, and an average expansion ratio of the irradiated area is 1.82 times.

H1, H2 and H3 show distances between the re-condensing position ACP at which the illuminating light from the condensed light as a light source just behind the first plural-light-source forming part 301 enters the synthetic optical system of the first and second optical systems 310 and 320 and re-condenses, and a thirteenth surface as an exit-side surface of the convex lens 314b. The re-condensing position ACP is located in a space between the second fixed unit 314 and the first movable unit 315 beyond the first movable unit 315 by arranging the second optical system 320 in each of the states P1 to P3. This can move closer the two movable units, i.e., the first movable unit 315 and the second movable unit 316, and the increase the zooming ratio by increasing the moving amount of the movable unit.

r is a radius of curvature (unit: mm) in each plane. d is a plane interval (unit: mm). n is a refractive index of a medium to the incidence light (with a wavelength of 0.248 μm). k corresponds to the lens number of the synthetic optical system of the first and second optical systems 310 and 320 shown in FIG. 13.

Figures 14A, 14B, 14C:
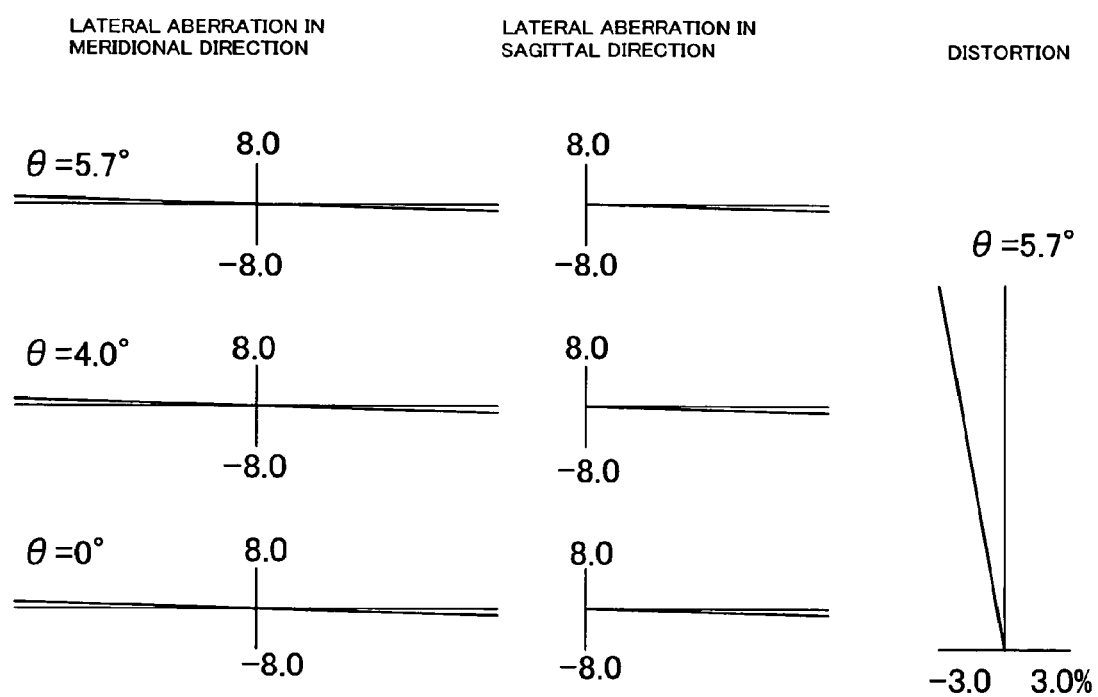
FIG. 14 is an aberrational diagram of a synthetic optical system of the first and second optical systems shown in FIG. 13 in the minimum σ state.
Figures 15A, 15B, 15C:
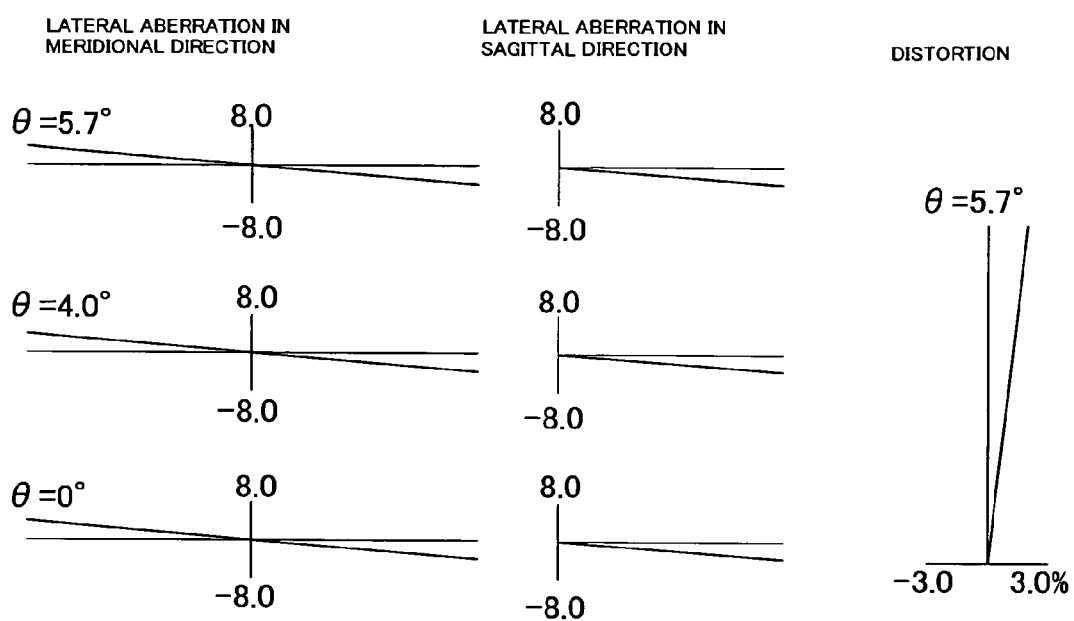
FIG. 15 is an aberrational diagram of the synthetic optical system of the first and second optical systems shown in FIG. 13 in the maximum σ state.

FIG. 14 is an aberrational diagram of the synthetic optical system of the first and second optical systems 310 and 320 shown in FIG. 13 in the minimum σ state P1. More specifically, FIG. 14A is a lateral aberration diagram in the meridional direction of the synthetic optical system in the minimum σ state P1, FIG. 14B is its lateral aberration diagram in the sagittal direction, and FIG. 14C is its distortion diagram. FIG. 15 is an aberrational diagram of the synthetic optical system of the first and second optical systems 310 and 320 shown in FIG. 13 in the maximum σ state P3. More specifically, FIG. 15A is a lateral aberration diagram in the meridional direction of the synthetic optical system in the maximum σ state P3, FIG. 15B is its lateral aberration diagram in the sagittal direction, and FIG. 15C is its distortion diagram. FIGS. 14 and 15 show the lateral aberration that has substantially reduced to a permissible range, and the properly corrected distortion.

The σ variable optical system 300 of the instant embodiment can expand the variable range of the irradiated area by the exit light by arranging the second optical system 320 while using the first optical system 310 as the simplest zooming optical system that includes two movable units. Moreover, the σ variable optical system 300 can reduce the lateral aberration to a substantially permissible range, correct the distortion properly without the re-condensing position in the optical element, and maintain the telecentricity of the exit light from the σ variable optical system 300 within the substantially permissible range.

Figure 16:
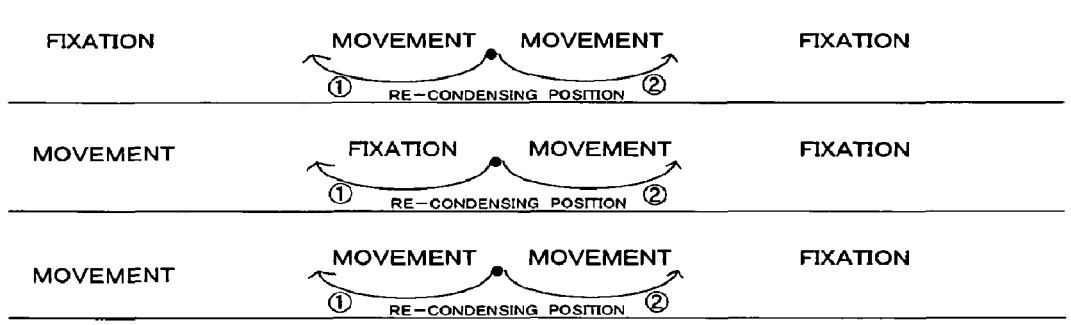
FIG. 16 graphically shows a re-condensing position that moves through a second optical system, in the first optical system composed of four unit.

Since the first optical systems 210 and 310 have been described as a zooming optical system of an expansion system, the re-condensing position is moved to the incident side by arranging the second optical systems 220 and 320. On the other hand, the re-condensing position is moved to the exit side when the first optical systems 210 and 310 are formed as a zooming optical system of a reduction system. Moreover, the present invention can also be applied to the first optical system that includes three movable units. For example, where the first optical system includes four units, e.g., first to forth units, and the re-condensing position is located between the second and third units, FIG. 16 shows a resultant arrangement of the second optical system. Here, FIG. 16 graphically shows a movable re-condensing position as a result of an arrangement of the second optical system in the first optical system that includes four units.

Referring to FIG. 16, suppose that the first and fourth units are fixed units and the second and third units are movable units. If the second unit is concave and the third unit is convex, the re-condensing position moves between the first and second units by arranging the second optical system. If the second unit is convex and the third unit is concave, the re-condensing position moves between the second and third units by arranging the second optical system. On the other hand, suppose that the second and fourth units are fixed units and the first and third units are movable units. If the second unit is concave and the third unit is convex, the re-condensing position moves between the first and second units by arranging the second optical system. If the second unit is convex and the third unit is concave, the re-condensing position moves between the second and third units by arranging the second optical system. Besides, suppose that the fourth unit is a fixed unit, while the first, second and third units are movable units. If the second unit is concave and the third unit is convex, the re-condensing position moves between the first and second units by arranging the second optical system. If the second unit is convex and the third unit is concave, the re-condensing position moves between the second and third units by arranging the second optical system.

The arrangement part 400 arranges the second optical system 220 or 320 along the optical path of the first optical system 210 or 310. The arrangement part 400, for example, arranges the second optical system 220 by arranging the parallel plate 212 and the second optical system 220 on a turret, and by rotating the turret. Also, the arrangement part 400 arranges the second optical system 220 by arranging a pass hole that allows the illuminating light to pass, and the second optical system 320 on the turret, and by rotating the turret. The arrangement part 400 also serves to control an arrangement and a non-arrangement of the second optical system 220 or 230 according to the irradiated area.

As explained above, the illumination optical system of the present invention can arrange the optical element apart from the re-condensing position (or at a position with high light energy density), and prevent the deterioration in the internal transmittance of the optical element used as the material of lens and deterioration of anti-reflection coating given to a surface of the lens. As a result, the present invention can prevent the lowered throughput due to the light intensity deterioration in the illumination optical system.

Moreover, a high magnification of the σ variable optical system in the illumination optical system becomes free from the restrictions by the re-condensing position, and the present invention can provide a σ variable optical system as a simple zooming optical system with a wide zooming ratio. Thereby, the present invention can realize a wider irradiated area (or a wider illumination state), and provide an illumination apparatus and an exposure apparatus that can form more various circuit patterns in the semiconductor device fabricating process. For example, even if the NA of the projection optical system is 0.8 or higher, the σ variable optical system in the inventive illumination optical system enables the exposure apparatus to set the coherence factor σ between from 0.2 to 1.0, which is a ratio between the NA of the projection optical system and the NA of the illumination optical system.

Figure 17:
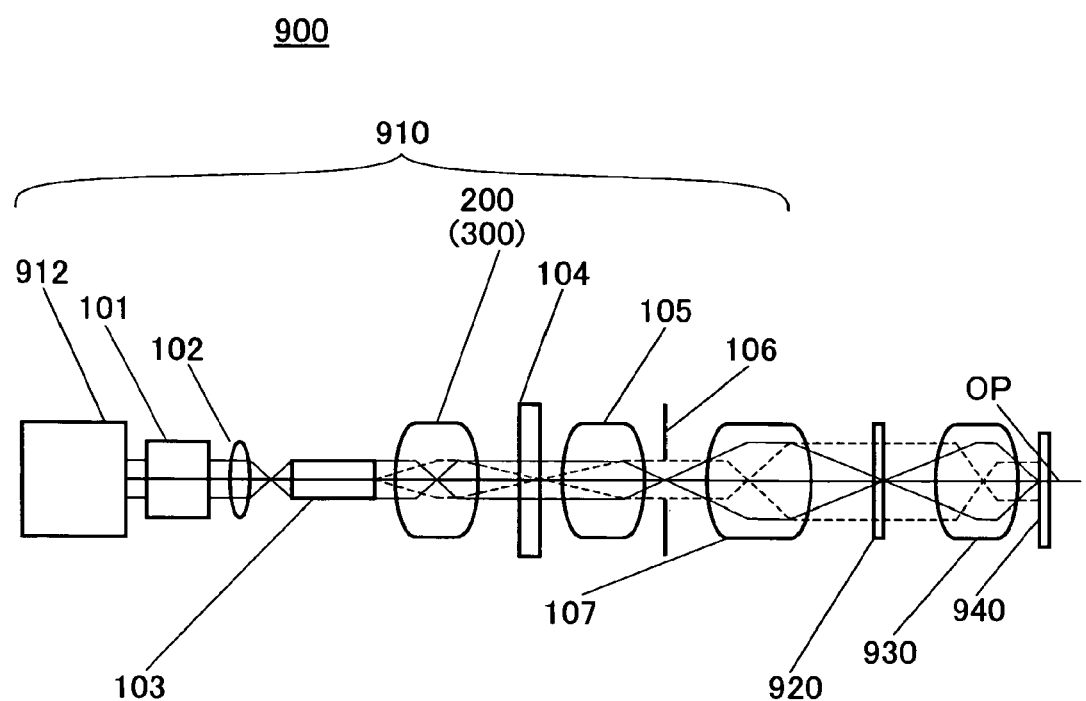
FIG. 17 is a simplified optical-path diagram of an exposure apparatus as one aspect according to the present invention.

Referring now to FIG. 17, a description will be given of an exemplary exposure apparatus that can apply the present invention. Here, FIG. 17 is a simplified optical-path diagram of an exposure apparatus 900 as one aspect according to the present invention. The exposure apparatus 900 includes an illumination apparatus 910 for illuminating a reticle (or mask) 920 which forms a circuit pattern, a projection optical system 930 that projects diffracted light from the illuminated reticle pattern, onto a plate 940.

The exposure apparatus 900 is a projection exposure apparatus that exposes onto the plate 940 a circuit pattern created on the reticle 920, e.g., in a step-and-repeat or a step-and-scan manner. Such an exposure apparatus is suitable for a sub-micron or quarter-micron lithography process. This embodiment exemplarily describes a step-and-scan exposure apparatus (which is also called "a scanner").

The illumination apparatus 910 which illuminates the reticle 920 that forms a circuit pattern to be transferred, includes a light source unit 912 and an illumination optical system. The illumination apparatus can apply the illumination optical system 200 and other members.

As an example, the light source unit 912 uses a light source such as an ArF excimer laser with a wavelength of approximately 193 nm, a KrF excimer laser with a wavelength of approximately 248 nm and a $F_2$ laser with a wavelength of approximately 157 nm. However, the laser type is not limited.

The illumination optical system is an optical system that illuminates the reticle 920, and includes, the beam shaping optical system 101, the relay optical system 102, the first plural-light-source forming part 103, the σ variable optical system 200 or 300, the second plural-light-source forming part 104, the irradiation optical system 105, the masking blade 106, and the imaging optical system 107 in the instant embodiment, as in the configuration of the above illumination optical system 100.

The reticle 920 forms a circuit pattern (or an image) to be transferred, and is supported and driven by a reticle stage (not shown). Diffracted light emitted from the reticle 920 passes through the projection optical system 930 and is then projected onto the plate 940. The plate 940, such as a wafer and a LCD, is an exemplary object to be exposed. A photoresist is applied onto the plate 940. The reticle 920 and the plate 940 are located in an optically conjugate relationship. Since the exposure apparatus 900 is a scanner, the reticle 920 and the plate 940 are scanned at the speed ratio of the reduction ratio of the projection optical system 930, thus transferring the pattern from the reticle 920 to the plate 940. If it is a step-and-repeat exposure apparatus (referred to as a "stepper"), the reticle 920 and the plate 940 remains still when exposing the reticle pattern.

The projection optical system 930 may use an optical system comprising solely of a plurality of lens elements, an optical system including a plurality of lens elements and at least one concave mirror (a catadioptric optical system), an optical system including a plurality of lens elements and at least one diffractive optical element such as a kinoform, a full mirror type optical system, and so on. Any necessary correction of the chromatic aberration may be accomplished by using a plurality of lens units made from glass materials having different dispersion values (Abbe values) or arranging a diffractive optical element such that it disperses light in a direction opposite to that of the lens unit.

In exposure, light is emitted from the light source unit 912, e.g., Koehler-illuminates the reticle 920 via the illumination optical system. Light that passes through the reticle 920 and reflects the reticle pattern is imaged onto the plate 940 by the projection optical system 930. In that case, the best σ can be obtained by the illumination optical system that the illumination optical system 100 of the present invention is applied according to the reticle pattern. Therefore, the desired resolution is achieved, and the high-quality exposure can be given to the plate 940. Moreover, in the illumination optical system, because the deterioration of the internal transmittance of the lens and the deterioration of the anti-reflection coating given to the surface of the lens that originate in the condenser, the light intensity deterioration can be prevented, and provide high-quality devices with high throughput and economic efficiency.

Figure 18:
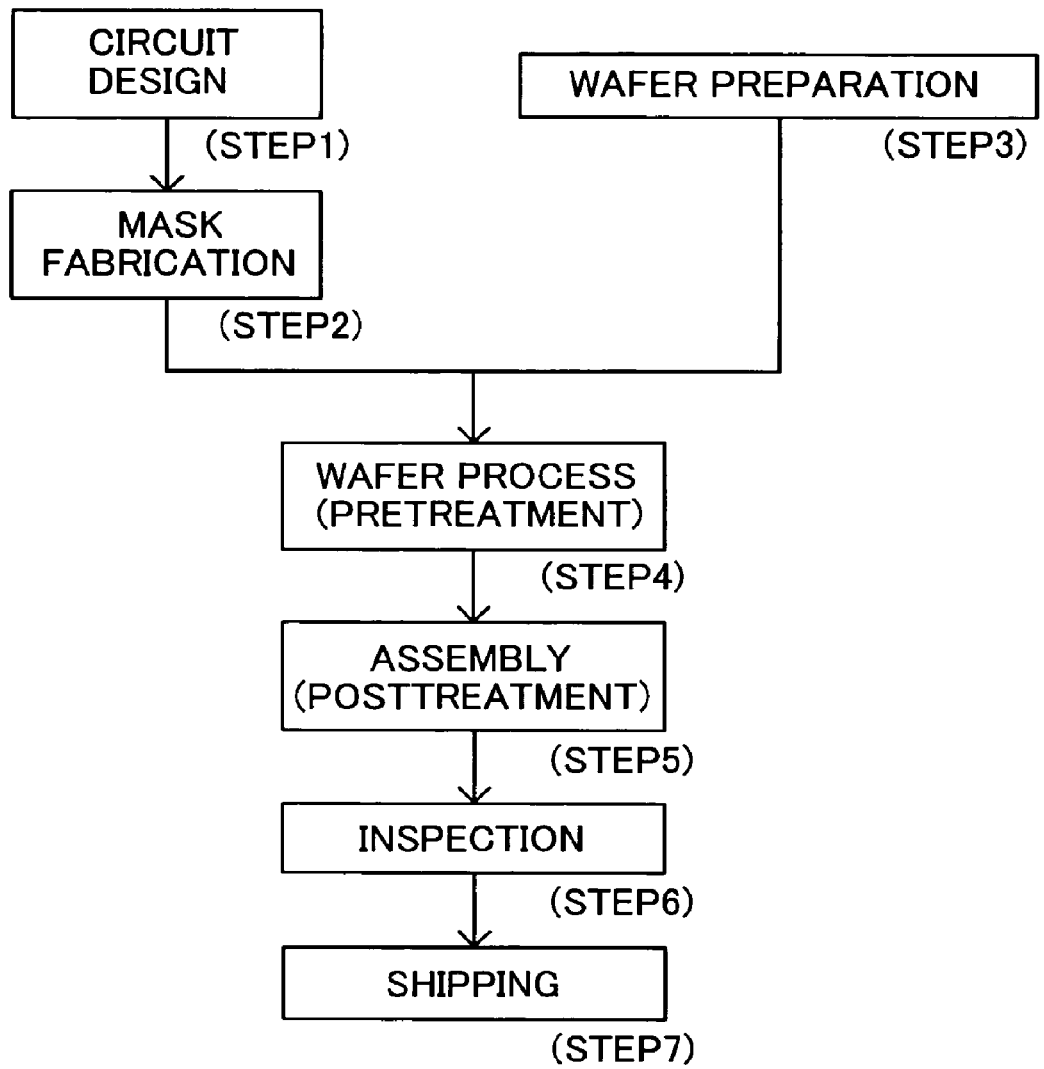
FIG. 18 is a flowchart for explaining how to fabricate devices.
Figure 19:
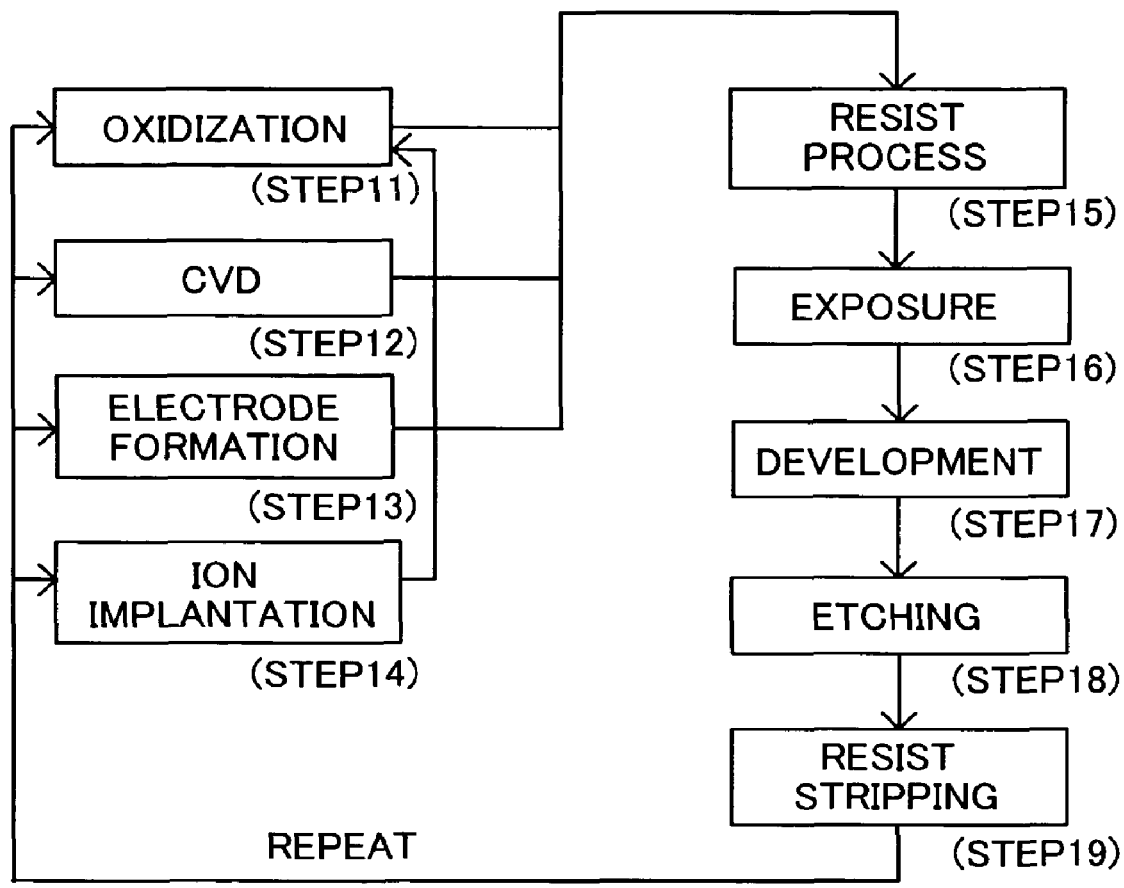
FIG. 19 is a detailed flowchart of a wafer process in Step 4 of FIG. 18.
Figure 20A:
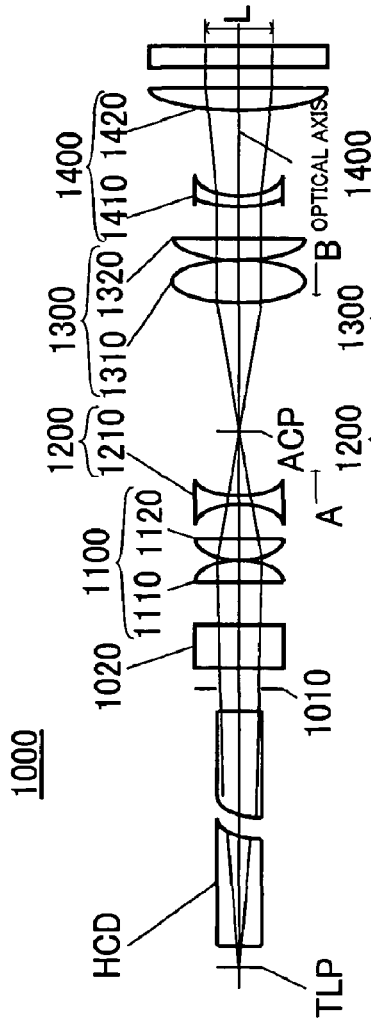
FIG. 20 is a simplified optical-path diagram for a σ variable optical system.
Figure 20B:
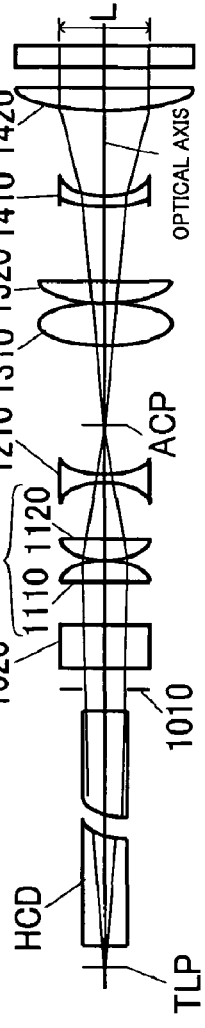
Figure 20C:
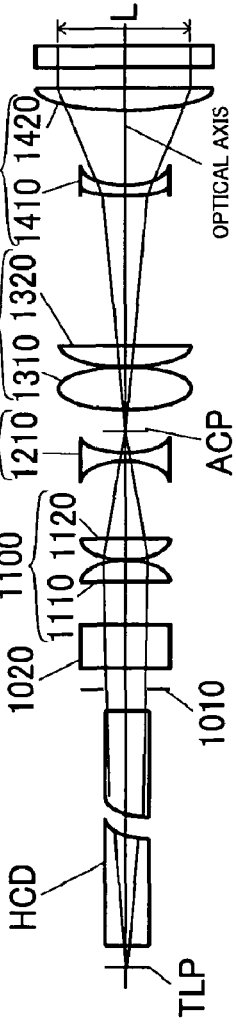

Referring now to FIGS. 18 and 19, a description will be given of an embodiment of a device fabrication method using the above mentioned exposure apparatus 900. FIG. 18 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 19 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 or 100A to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The fabrication method of the instant embodiment can obtain the desired σ by the illumination optical system 100, and can fabricate higher-quality devices (in other words, the desired stroke width devices). Thus, the device fabrication method using the exposure apparatus 900, and resultant devices constitute one aspect of the present invention.

Furthermore, the present invention is not limited to these preferred embodiments and various variations and modifications may be made without departing from the scope of the present invention.

Thus, the present invention provides an illumination optical system and an exposure apparatus having the same that prevents lowered throughput due to the light intensity deterioration, expands a zooming range, and provides high-quality exposure.

What is claimed is:

1. An illumination optical system for illuminating an object surface by condensing light from a light source and forming a light-condensing point, said illumination optical system comprising, in order from a side of the light source:
    a first switching optical system and a second switching optical system switchably inserted into an optical path of said illumination optical system; and
    a movable optical system movable in a direction of an optical axis of said illumination optical system and moving along the optical axis to vary an irradiated area on an incident surface of means for forming a secondary light source,
    wherein power of said second switching optical system is larger than power of said first switching optical system,
    wherein the light-condensing point is formed at a side of the object surface relative to said movable optical system when said first switching optical system is inserted in the optical path, and the light-condensing point is formed at the side of the light source relative to said movable optical system when said second switching optical system is inserted in the optical path, and
    wherein a shape of the irradiated area in the incident surface is maintained through a state that the first switching optical system is inserted into the optical path and a state that the second switching optical system is inserted into the optical path.

2. An illumination optical system according to claim 1, wherein the power of said first switching optical system is zero, and wherein said second switching optical system is a lens system of a positive power.

3. An illumination optical system according to claim 1, wherein said movable optical system increases the irradiated area by moving along the optical axis toward the side of the object surface and reduces the irradiated area by moving along the optical axis toward the side of the light source.

4. An exposure apparatus comprising:
    an illumination optical system according to claim 1 for illuminating a reticle; and
    a projection optical system for projecting a pattern of the reticle onto an object.

5. A device fabrication method comprising the steps of:
    exposing an object using an exposure apparatus according to claim 4; and
    performing a development process for the object exposed.

6. An illumination optical system for illuminating an object surface by condensing light from a light source and forming a light-condensing point, said illumination optical system comprising, in order from a side of the light source:
    an insertable/removable optical system that can be inserted into and removed from an optical path of said illumination optical system; and
    a movable optical system movable in a direction of an optical axis of said illumination optical system and moving along the optical axis to vary an irradiated area on an incident surface of means for forming a secondary light source,
    wherein said insertable/removable optical system has a positive power,
    wherein the light-condensing point is formed at a side of the object surface relative to said movable optical system when said insertable/removable optical system is removed from the optical path, and the light-condensing point is formed at the side of the light source relative to said movable optical system when said insertable/removable optical system is inserted in the optical path, and
    wherein a shape of the irradiated area on the incident surface is maintained through a state that said insertable/removable optical system is inserted into the optical path and a state that said insertable/removable optical system is removed from the optical path.

7. An illumination optical system according to claim 6, wherein said movable optical system increases the irradiated area by moving along the optical axis toward the side of the object surface and reduces the irradiated area by moving along the optical axis toward the side of the light source.

8. An exposure apparatus comprising:
    an illumination optical system according to claim 6 for illuminating a reticle; and
    a projection optical system for projecting a pattern of the reticle onto an object.

9. A device fabrication method comprising the steps of:
    exposing an object using an exposure apparatus according to claim 8; and
    performing a development process for the object exposed.

10. An illumination optical system according to claim 6, wherein said insertable/removable optical system is a lens system of a positive power.

* * * * *